(12) United States Patent
Yoshino

(10) Patent No.: US 7,723,131 B2
(45) Date of Patent: May 25, 2010

(54) MANUFACTURING METHOD OF A SEMICONDUCTOR DEVICE, AND PASTE APPLICATOR

(75) Inventor: Shuetsu Yoshino, Nanae (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/186,754

(22) Filed: Jul. 22, 2005

(65) Prior Publication Data

US 2006/0016540 A1   Jan. 26, 2006

(30) Foreign Application Priority Data

Jul. 23, 2004   (JP) .............................. 2004-215938

(51) Int. Cl.
*G01R 31/26*   (2006.01)
*H01L 21/66*   (2006.01)

(52) U.S. Cl. .................... 438/15; 257/E21.505; 156/64

(58) Field of Classification Search .................. 438/15, 438/14, 5; 257/E21.505; 156/64
See application file for complete search history.

(56) References Cited

U.S. PATENT DOCUMENTS

| | | | | |
|---|---|---|---|---|
| 3,505,261 | A * | 4/1970 | Battersby | 523/437 |
| 4,146,924 | A * | 3/1979 | Birk et al. | 700/259 |
| 4,381,601 | A * | 5/1983 | Tamai et al. | 29/740 |
| 4,646,676 | A * | 3/1987 | Kidder et al. | 118/243 |
| 4,770,599 | A * | 9/1988 | Hawkswell | 414/752.1 |
| 5,076,485 | A * | 12/1991 | MacKay | 228/177 |
| 5,415,693 | A * | 5/1995 | Yoneda et al. | 118/664 |
| RE35,027 | E * | 8/1995 | Ragard | 29/740 |
| 5,505,777 | A * | 4/1996 | Ciardella et al. | 118/663 |
| 5,766,361 | A * | 6/1998 | Stansbury | 118/679 |
| 5,932,012 | A * | 8/1999 | Ishida et al. | 118/669 |
| 5,977,640 | A * | 11/1999 | Bertin et al. | 257/777 |
| 6,129,040 | A * | 10/2000 | Viggiano et al. | 118/323 |
| 6,181,569 | B1 * | 1/2001 | Chakravorty | 361/761 |
| 6,230,393 | B1 * | 5/2001 | Hirano et al. | 29/740 |
| 6,493,931 | B2 * | 12/2002 | Hirano et al. | 29/832 |
| 6,559,666 | B2 * | 5/2003 | Bernier et al. | 324/755 |
| 6,708,402 | B2 * | 3/2004 | Hirano et al. | 29/833 |
| 6,781,221 | B2 * | 8/2004 | Yoneda | 257/678 |
| 6,789,720 | B2 * | 9/2004 | Uchida et al. | 228/22 |
| 6,957,759 | B2 * | 10/2005 | Uchida et al. | 228/22 |
| 7,048,172 | B2 * | 5/2006 | Uchida et al. | 228/22 |
| 2001/0010120 | A1 * | 8/2001 | Hirano et al. | 29/832 |

(Continued)

FOREIGN PATENT DOCUMENTS

JP   8-057382   3/1996

*Primary Examiner*—Jarrett J Stark
(74) *Attorney, Agent, or Firm*—Mattingly & Malur, P.C.

(57) ABSTRACT

Speed-up of a die bonding process for mounting a semiconductor chip onto a wiring substrate and improvement of a semiconductor package manufacturing yield are to be attained. A paste applicator comprises a drive section and a movable section supported by the drive section. The movable section includes a holder body adapted to move vertically along a main shaft with rotation of a motor in the drive section and a nozzle holder screwed to the holder body. A nozzle secured to a lower end of a syringe is screwed to the nozzle holder. Using a height sensor fixed to a main shaft support portion in the drive section, the paste applicator detects a positional deviation quantity with time of the movable section relative to the drive section and corrects a descent distance of the movable section on the basis of the positional deviation quantity.

4 Claims, 38 Drawing Sheets

U.S. PATENT DOCUMENTS

| | | | |
|---|---|---|---|
| 2001/0010498 A1* | 8/2001 | Hirano et al. | 340/686.2 |
| 2002/0070460 A1* | 6/2002 | Uchida et al. | 257/780 |
| 2005/0017052 A1* | 1/2005 | Uchida et al. | 228/22 |
| 2005/0023326 A1* | 2/2005 | Uchida et al. | 228/22 |
| 2005/0023681 A1* | 2/2005 | Uchida et al. | 257/737 |
| 2005/0212837 A1* | 9/2005 | Nakagawa et al. | 347/8 |
| 2006/0107524 A1* | 5/2006 | Engle et al. | 29/840 |

* cited by examiner

MANUFACTURING METHOD OF A SEMICONDUCTOR DEVICE, AND PASTE APPLICATOR

CROSS-REFERENCE TO RELATED APPLICATION

The present application claims priority from Japanese patent application No. 2004-215938 filed on Jul. 23, 2004, the content of which is hereby incorporated by reference into this application.

BACKGROUND OF THE INVENTION

The present invention relates to a semiconductor device manufacturing technique and more particularly to a technique applicable effectively to the manufacture of a semiconductor device, including a die bonding step of bonding a semiconductor chip to a wiring substrate or the like with use of adhesive paste.

Recently, in the field of small-sized electronic devices such as portable terminal communication devices, a stacked package in which plural semiconductor chips are mounted in a three-dimensional manner onto a small-sized wiring substrate has been used practically for the purpose of promoting a high-density packaging of a semiconductor device.

As a die bonding method for bonding a semiconductor chip onto a wiring substrate or onto another semiconductor chip there is adopted a method wherein a tape with pressure-sensitive adhesive called Die Attach Film is affixed beforehand to a back surface of a semiconductor chip and is heated to bond the semiconductor chip to a base to be coated or a method wherein adhesive paste (hereinafter referred to simply as "paste") is applied to a wiring substrate or the surface of a semiconductor chip with use of a paste applicator and a semiconductor chip is bonded thereon.

Patent Literature 1 (Japanese Unexamined Patent Publication No. Hei 8(1996)-57382) discloses a device for detecting the height of a liquid application nozzle wherein in adjacency to a nozzle for applying a liquid material to the surface of a plate-like workpiece there are disposed plural height sensors which are moved integrally with the nozzle so that the liquid material can be applied accurately to the surface of the plate-like workpiece having a warp.

[Patent Literature 1]

Japanese Unexamined Patent Publication No. Hei 8 (1996)-57382

SUMMARY OF THE INVENTION

In the semiconductor package assembling process, speed-up is being promoted with the recent tendency to higher performance of device, and also in the die bonding process there exists a demand for speed-up. However, of the foregoing two die bonding methods, in the method using a tape with pressure-sensitive adhesive called Die Attach Film, the pressure-sensitive adhesive is cured while applying pressure and heat to the semiconductor chip with Die Attach Film affixed thereto, thus giving rise to the problem that it takes time for the bonding. Additionally, the manufacturing cost of Die Attach Film is high.

On the other hand, a paste applicator includes a syringe which is a container to be charged with paste and a nozzle attached to a lower end of the syringe. The paste charged into the syringe is discharged from an orifice of the nozzle by pneumatic pressure for example. As nozzles for the supply of paste there are known different types of nozzles, including single nozzle, multi-nozzle, and divergent nozzle. Particularly, a multi-nozzle constituted by a bundle of plural single nozzles is advantageous in that paste is discharged from orifices of plural nozzles at a time and that therefore the paste can be applied over a wide area in a short time.

In the method of bonding a semiconductor chip with use of paste, in order to bond the semiconductor chip in a short time, it is necessary to decrease the content of a volatile component (solvent) contained in the paste and thereby afford a high viscosity paste. However, for supplying a high viscosity paste quickly to a to-be-coated surface of a wiring substrate or a semiconductor chip, it is necessary that, during application of the paste, the tip of the nozzle be approximated to the to-be-coated surface up to a distance of about 70 to 130 μm from the same surface.

However, fine warps and concaves and convexes are present on the surface of the wiring substrate and semiconductor chip. Besides, the syringe and nozzle holder are fixed to the body of the paste application with use of screws, therefore, there occurs loosening of the screws as the paste application work is repeated, with consequent displacement of the movable portion relative to the fixed portion in the paste applicator.

Thus, it is difficult to ensure a gap of about 70 to 130 μm between the nozzle tip and the to-be-coated surface. Particularly, in the die bonding process for a stacked package, since paste is supplied to the surface of a semiconductor chip mounted on a wiring substrate, if the nozzle tip comes into contact with the surface of the semiconductor chip, there occur fine cracking and chipping, or the damage of circuit may occur.

It is an object of the present invention to provide a technique for improving the manufacturing yield of a die bonding process using paste.

It is another object of the present invention to provide a paste applicator capable of controlling highly accurately the gap between a paste supply nozzle and paste for application to a surface to be coated.

It is a further object of the present invention to provide a technique capable of reducing the cost for fabricating a semiconductor package wherein a semiconductor chip is stacked on a wiring substrate with use of paste.

The above and other objects and novel features of the present invention will become apparent from the following description and the accompanying drawings.

Typical modes of the present invention as disclosed herein will be outlined below.

A method of manufacturing a semiconductor device, comprising the step of placing a base substrate with a plurality of semiconductor chips mounted side by side on a main surface thereof onto an XY table and supplying paste to a surface of each of the semiconductor chips while approximating a paste supply nozzle of a paste applicator disposed above the XY table to the chip surfaces in order, the paste applicator comprising a drive section adapted to be moved horizontally above the XY table, a movable section supported by the drive section and adapted to be moved vertically by the drive section, and the nozzle supported by the movable section, the step of supplying the paste to the surface of each of the plural semiconductor chips comprising the steps of:

(a) moving first measuring means installed in the drive section of the paste applicator to a position above a first semiconductor chip out of the plural semiconductor chips and measuring a distance (A) between the surface of the first semiconductor chip and the first measuring means;

(b) moving the nozzle supported by the movable section of the paste applicator to a stand-by position above the first semiconductor chip and thereafter lowering the movable section to bring down the nozzle from the stand-by position to the surface of the first semiconductor chip;

(c) after the step (b), raising the movable section to raise the nozzle to a first discharge position close to the surface of the first semiconductor chip;

(d) raising the nozzle from the first discharge position to the stand-by position and thereafter measuring a distance (B) as a raised distance of the movable section during the rise of the nozzle from the first discharge position to the stand-by position;

(e) after the step (d), moving the first measuring means installed in the drive section to a position above a second semiconductor chip out of the plural semiconductor chips and measuring a distance (A') between the surface of the second semiconductor chip and the first measuring means;

(f) measuring a vertical displacement quantity (C) of the movable section relative to the drive section which has occurred during the period from the step (a) to the step (e), using second measuring means installed in the drive section;

(g) after the step (f), calculating a difference (A-A') between the distance (A) measured in the step (b) and the distance (A') measured in the step (e) and calculating a distance (B') by correcting the distance (B) on the basis of the displacement quantity (C) measured in the step (f);

(h) moving the nozzle to a stand-by position above the second semiconductor chip and thereafter lowering the movable section by the distance (B') to bring down the nozzle from the stand-by position to a second discharge position close to the surface of the second semiconductor chip; and (i) after the step (h), supplying the paste to the surface of the second semiconductor chip from the nozzle which lies in the second discharge position.

The following is a brief description of effect obtained by the typical modes of the present invention as disclosed herein.

It is possible to improve the manufacturing yield of a semiconductor package having semiconductor chips stacked on a wiring substrate using paste.

DETAILED DESCRIPTION OF PREFERRED EMBODIMENTS

Figure 1:
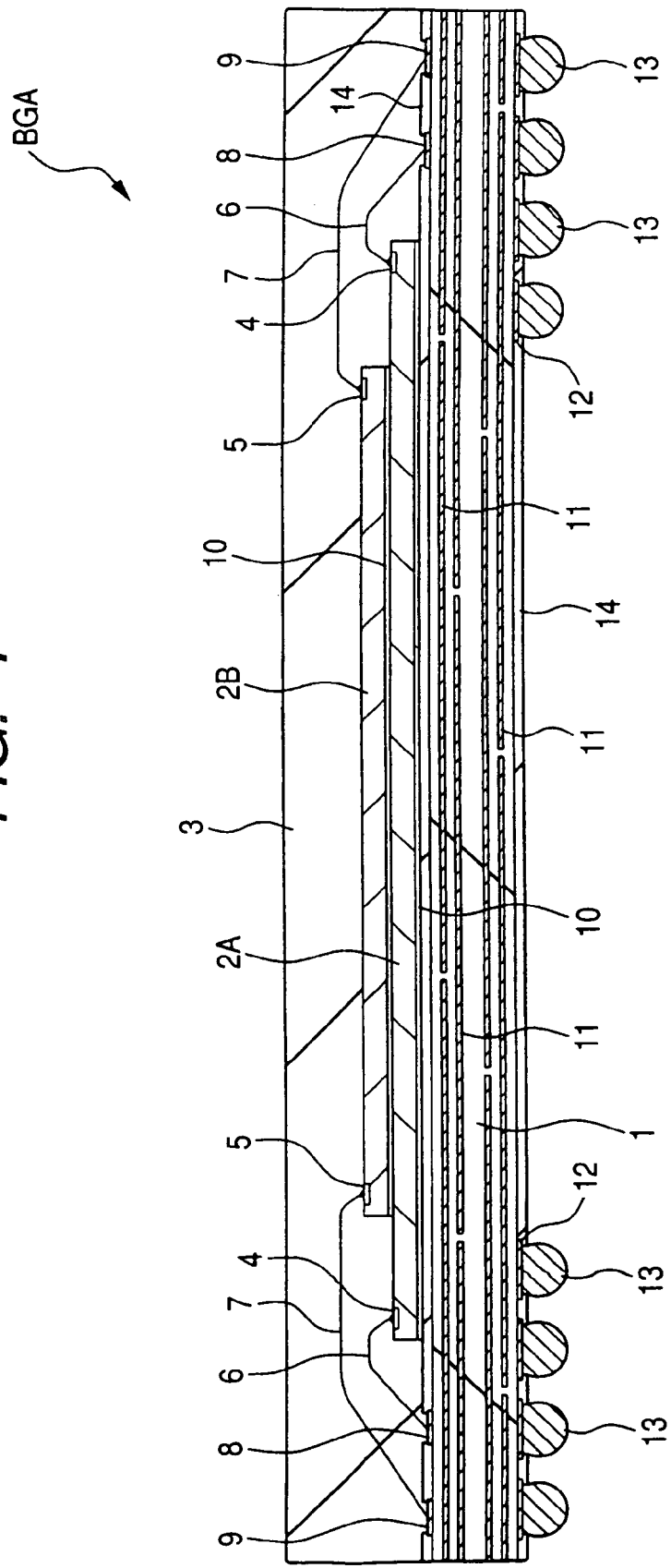
FIG. 1 is a sectional view of a stacked BGA obtained by the manufacturing method of the present invention.

Embodiments of the present invention will be described in detail hereinunder with reference to the accompanying drawings. In all of the drawings for illustrating the embodiments, the same members are identified by the same reference numerals in principle, and repeated explanations thereof will be omitted.

First Embodiment

In this first embodiment the present invention is applied to the manufacture of a stacked BGA (Ball Grid Array) having silicon chips stacked on a wiring substrate.

Figure 2:
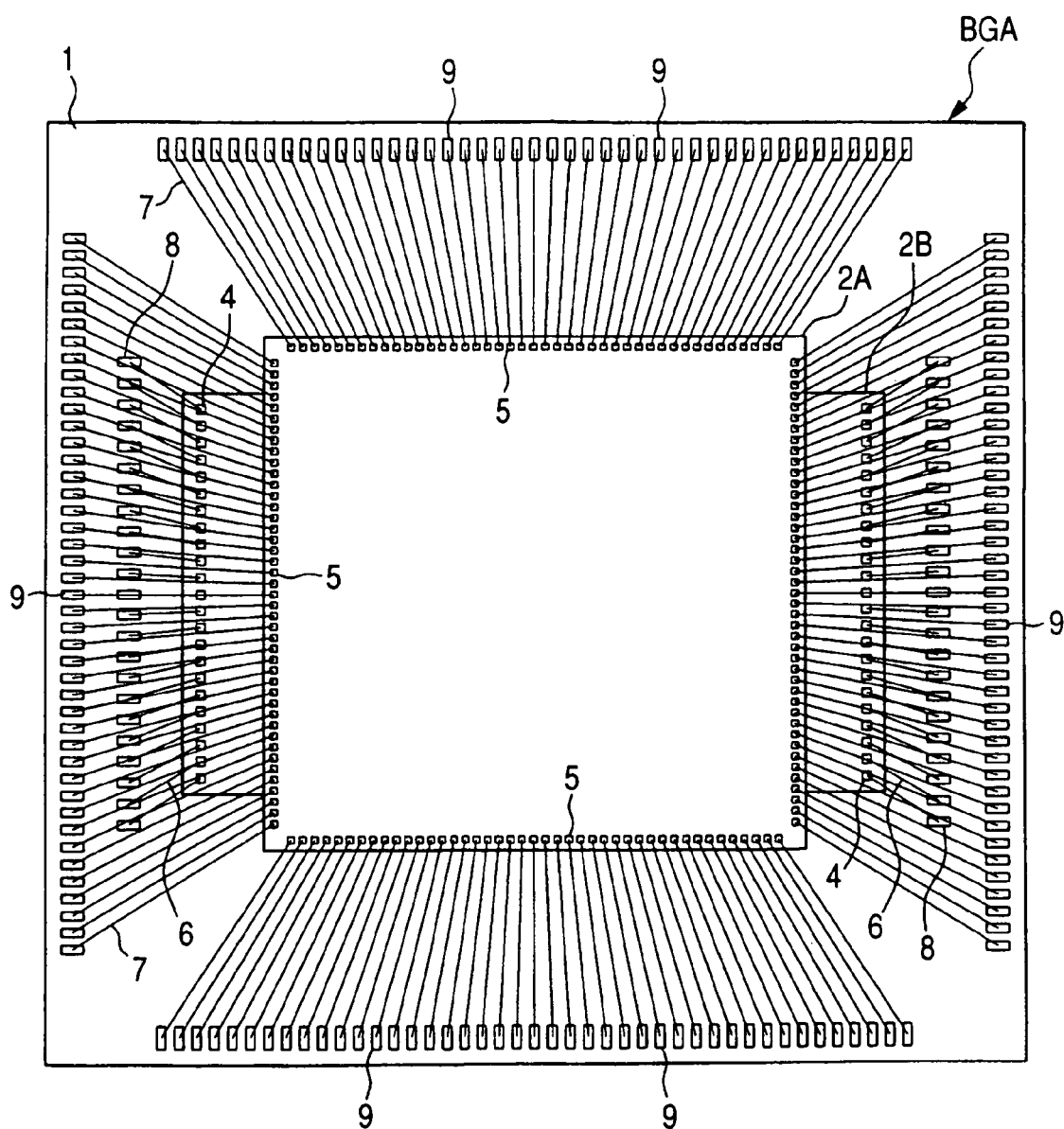
FIG. 2 is a plan view showing an internal structure of the stacked BGA shown in FIG. 1.

As shown in FIGS. 1 and 2, the BGA of this embodiment has a package structure wherein a memory chip 2A and a microcomputer chip 2B are stacked on a main surface of a single wiring substrate (to-be-coated base) and those two silicon chips (memory chip 2A and microcomputer chip 2B) are sealed with molding resin 3.

For example, a flash memory is formed in the lower memory chip 2A out of the two silicon chips (memory chip 2A and microcomputer chip 2B). The memory chip 2A formed with the flash memory has a rectangular plane shape, and plural bonding pads 4 are formed along the two short sides of a main surface (upper surface) of the memory chip 2A. The bonding pads 4 are electrically connected through Au wires 6 to electrodes 8 formed on the wiring substrate 1. Using paste (adhesive) 10, the memory chip 2A is bonded to the surface of the wiring substrate 1.

The microcomputer chip 2B stacked on the memory chip 2A is formed with a microprocessor (MPU: microprocessing unit) for example. The microcomputer chip 2B formed with the microprocessor has a square plane shape, and plural bonding pads 5 are formed along the four sides of a main surface (upper surface) of the microcomputer chip 2B. The bonding pads 5 are electrically connected through Au wires 7 to electrodes 9 formed on the wiring substrate 1. The microcomputer chip 2B is disposed centrally of the memory chip 2A and is bonded to the surface of the memory chip 2A with use of paste (adhesive) 10.

The two silicon chips (memory chip 2A and microcomputer chip 2B) are sealed with molding resin 3. For example, the molding resin 3 is a thermosetting epoxy resin with silicon filler incorporated therein.

Figure 3:
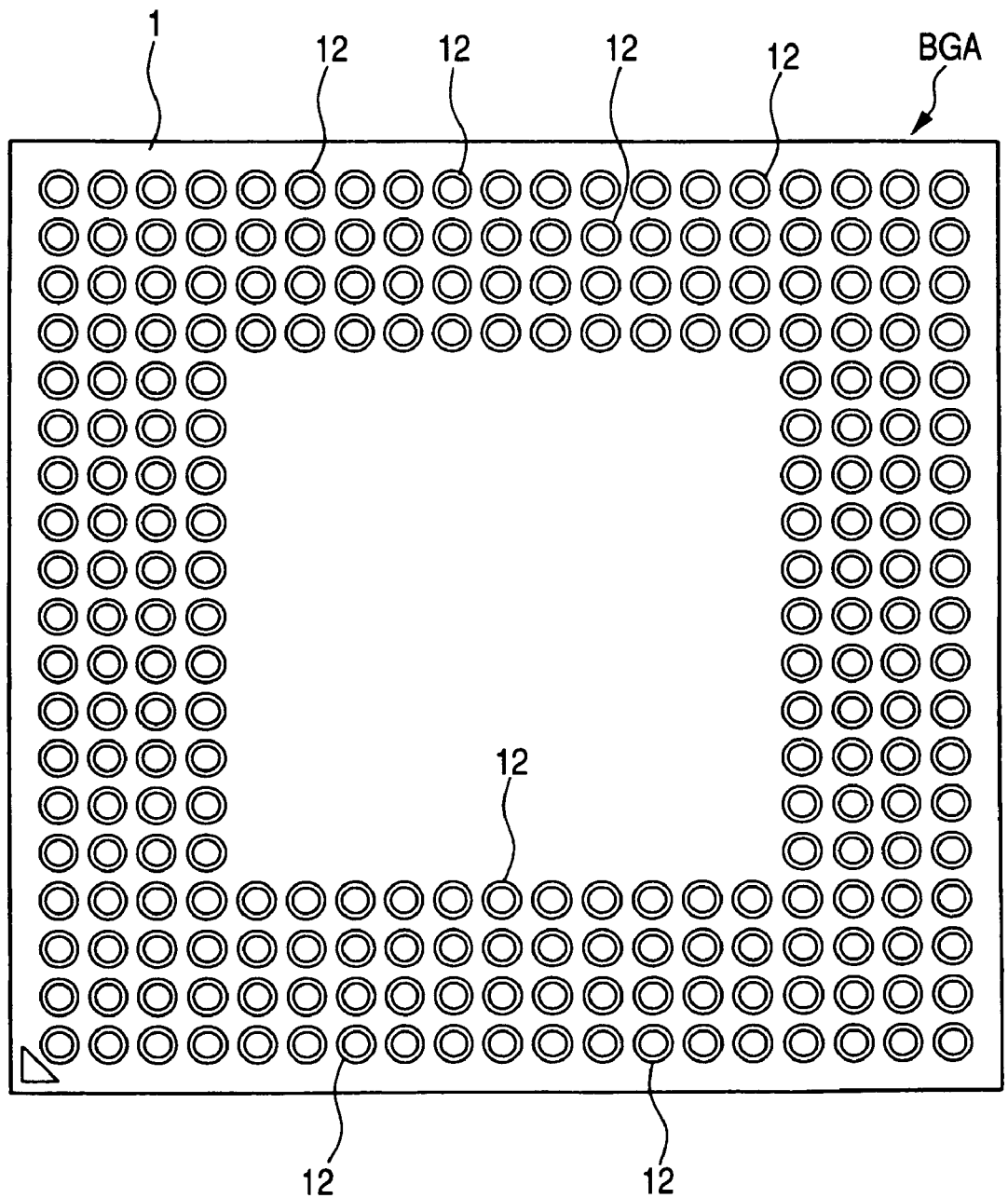
FIG. 3 is a plan view showing the layout of back electrodes in the stacked BGA shown in FIG. 1.

The wiring substrate 1 with the two silicon chips (memory chip 2A and microcomputer chip 2B) mounted thereon is mainly formed of a general-purpose resin such as a glass fabric-based epoxy resin. As inner layers in the wiring substrate 1 there are formed plural wiring layers 11 which are connected electrically to the electrodes 8 or 9. On a lower surface of the wiring substrate 1 there are formed back electrodes 12 which are connected electrically to the wiring layers 11. Solder bumps 13 which constitute external connecting terminals of BGA are connected electrically to the surface of the back electrodes 12. FIG. 3 is a plan view showing the layout of back electrodes 12 formed on the lower surface of the wiring substrate 1 (the solder bumps 13 are not shown).

The BGA of this embodiment is mounted on a mother board of various electronic devices through the solder bumps 13. That is, the wiring substrate 1 functions as a relay substrate (interposer) for mounting the memory chip 2A and the microcomputer chip 2B onto the mother board. The electrodes 8, 9, wiring layers 11 and back electrodes 12 formed on the wiring substrate 1 are made of Cu. Surfaces of the electrodes 8, 9 and the back electrodes 12 are plated with nickel (Ni) for example. The upper and lower surfaces of the wiring substrate 1 are coated with solder resist 14 of, for example, epoxy resin or acrylic resin exclusive of the surfaces of the electrodes 8, 9 and the back electrodes 12.

Figure 4:
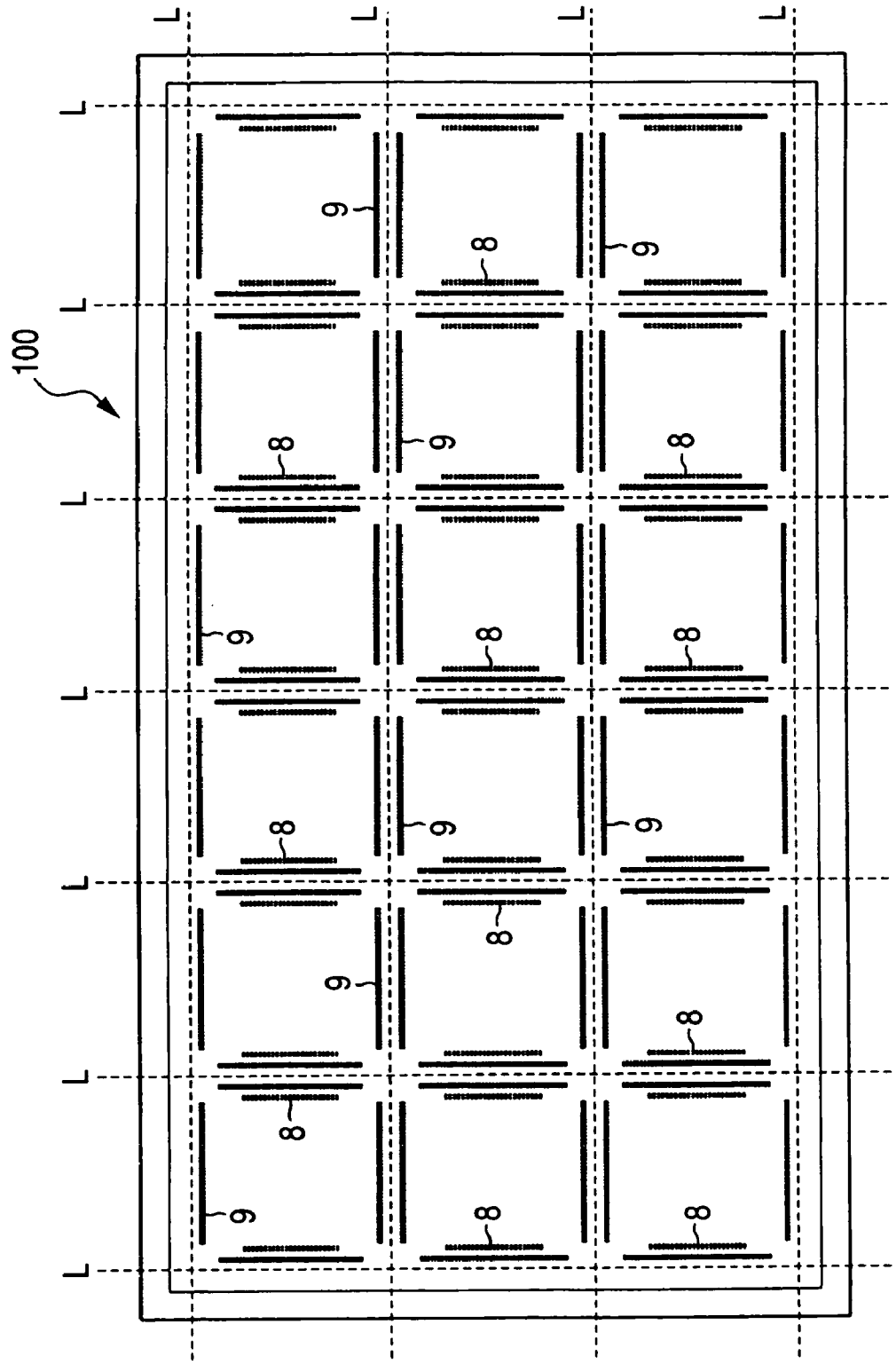
FIG. 4 is a plan view showing a main surface of a multi-wiring substrate used in manufacturing the stacked BGA.
Figure 5:
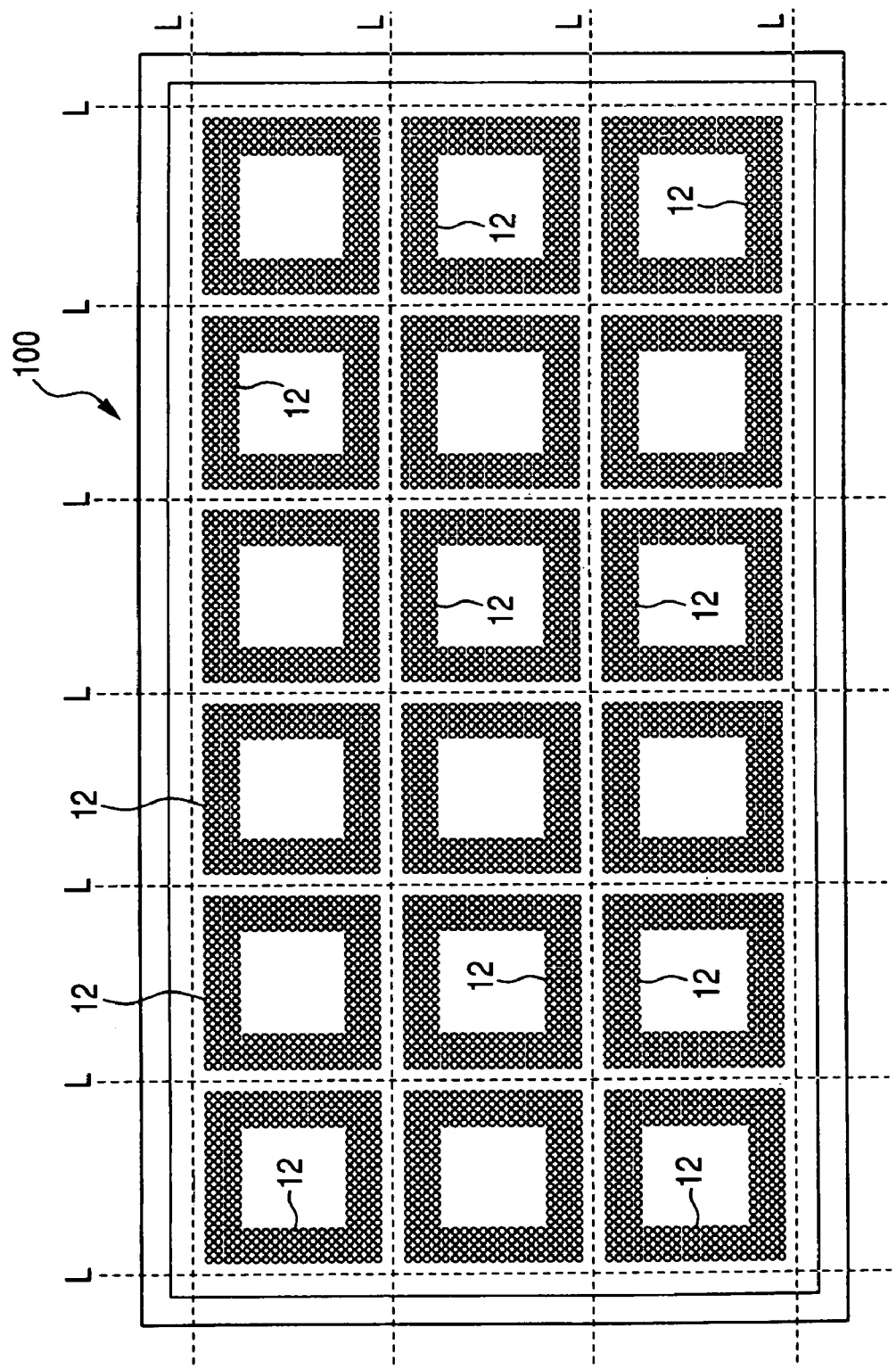
FIG. 5 is a plan view showing a back surface of the multi-wiring substrate.

FIG. 4 is a plan view showing a main surface (chip mounting surface) of a multi-wiring substrate 100 used in manufacturing the BGA of this embodiment and FIG. 5 is a plan view showing a back surface of the multi-wiring substrate 100.

The multi-wiring substrate 100 is a substrate serving as a matrix of the wiring substrate. By dicing the multi-wiring substrate 100 in a lattice shape along dicing lines L shown in the figures, there are obtained plural wiring substrates 1. For example, the illustrated multi-wiring substrate 100 is partitioned into six wiring substrate regions in its longitudinal direction and three wiring substrate regions in its transverse direction, whereby a total of 3×6=18 wiring substrates 1 are obtained. The electrodes 8 and 9 are formed on the main surface of each of the wiring substrate regions and the back electrodes 12 are formed on the back surface of each wiring substrate region. Further, though now shown in FIGS. 4 and 5, the plural wiring layers 11 are formed as inner layers in the multi-wiring substrate 100. The electrodes 8, 9 and the back electrodes 12 are formed by etching Cu foil affixed to the multi-wiring substrate 100 and subsequently plating the surface of the Cu foil.

In the manufacturing process for the multi-wiring substrate 100 there is performed a continuity test for each of the wiring substrate regions to check continuity between the electrodes 8, 9, as well as the back electrodes 12, and the wiring layers 11, and a defect mark (not shown) is put on the surface of a wiring substrate region including a defective portion. The defect mark is for preventing the silicon chips (memory chip 2A and microcomputer chip 2B) from being mounted on the wiring substrate region with the defect mark put thereon.

Figure 6:
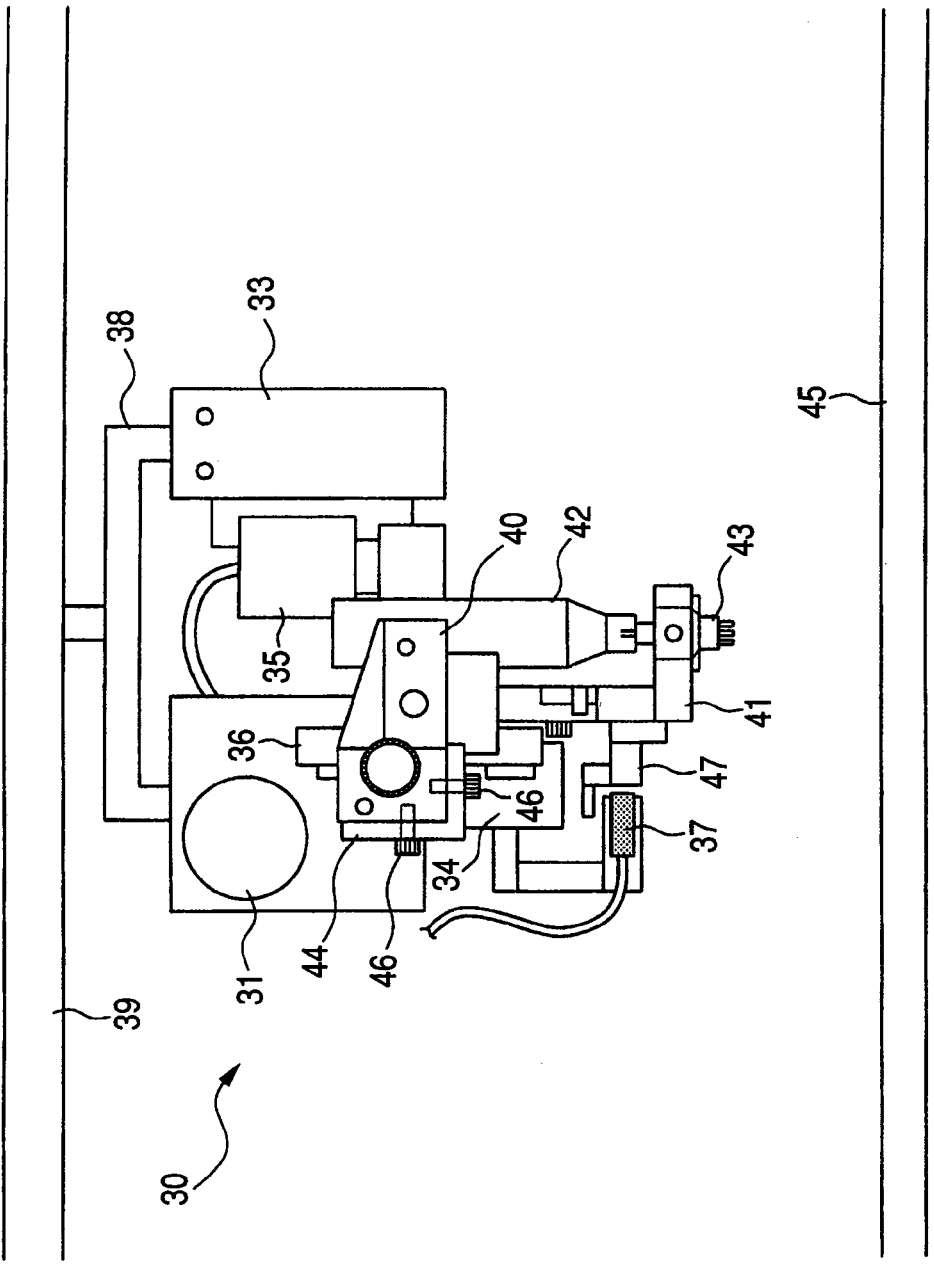
FIG. 6 is a schematic diagram showing a principal portion of a paste applicator according to the present invention.
Figure 7:
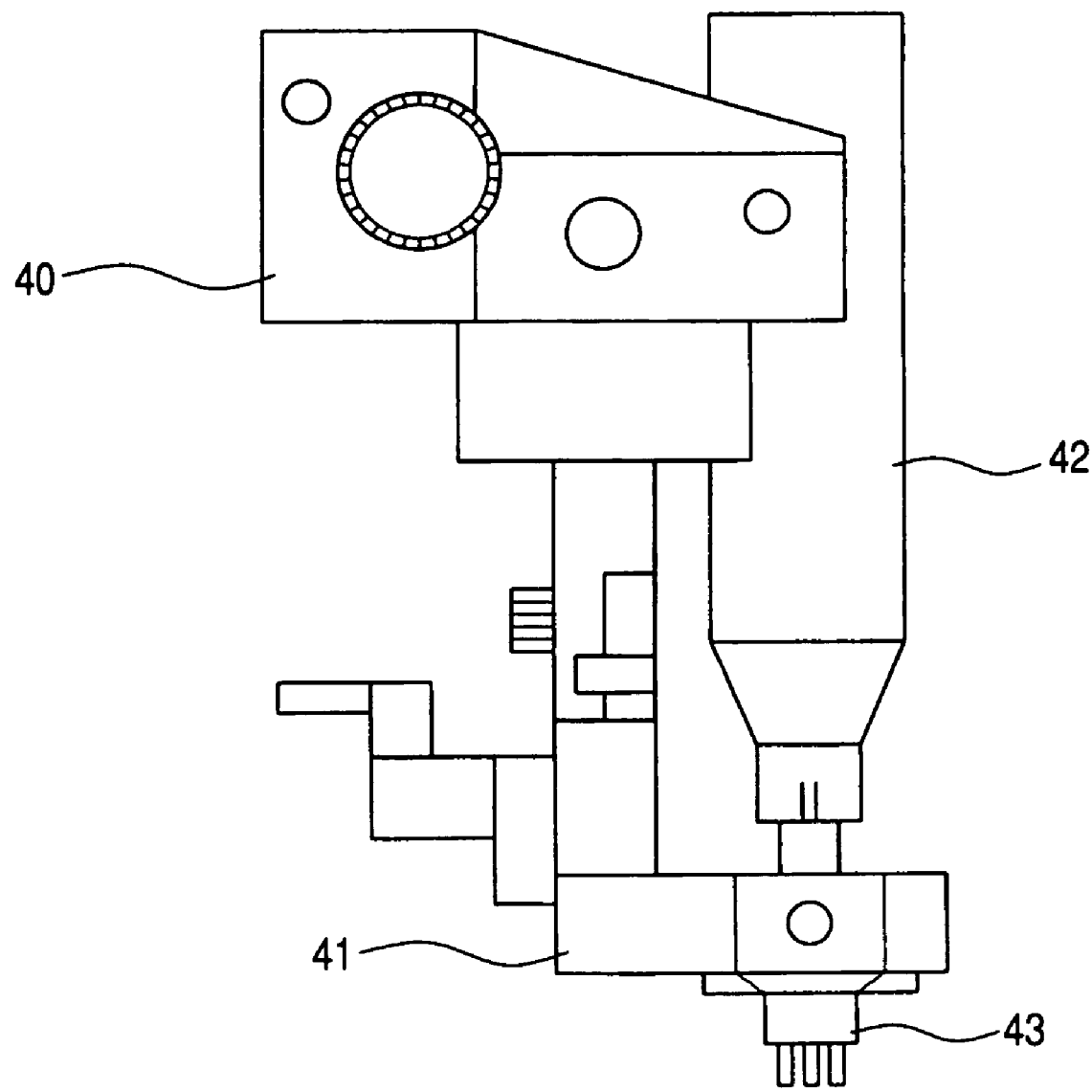
FIG. 7 is a schematic diagram showing a movable section of the paste applicator.

FIG. 6 is a schematic diagram showing a principal portion of a paste applicator 30 used in the process (die bonding process) of mounting the silicon chips (memory chip 2A and microcomputer chip 2B) in each of the wiring substrate regions on the multi-wiring substrate 100, and FIG. 7 is a schematic diagram showing a movable section of the paste application 30 shown in FIG. 6.

The paste applicator 30 is composed of a drive section and a movable section supported by the drive section. The drive section includes a motor 31 for moving the movable section vertically and a laser displacement meter (first measuring means) 33 for the measurement of height. A main shaft support portion 34 and a camera 35 are fixed to the motor 31 and the laser displacement meter 33, respectively. Further, a main shaft 36 and a height sensor (second measuring means) 37 are fixed to the main shaft support portion 34. The drive section composed of these members is suspended from a guide rail 39 through a hanger 38 and is adapted to move horizontally along the guide rail 39 by means of a moving mechanism (not shown).

The movable section of the paste applicator 30 includes a holder body 40 adapted to move vertically along the main shaft 36 with rotation of the motor 31 in the drive section and a nozzle holder 41 screwed to the holder body 40. The holder body 40 is fixed through screws 46 to an L block 44 which is fixed to the main shaft 36. By removing the screws 46, the whole of the movable section can be removed from the drive section.

A nozzle 43 attached to a lower end of a cylinder 42 is screwed to the nozzle holder 41 in the movable section. Though not shown in FIGS. 6 and 7, the interior of the cylinder 42 is charged with paste 10. A predetermined amount of the paste 10 is discharged to the exterior from the tip of the nozzle 43 by pneumatic pressure for example. The paste 100 is, for example, any of such known resin pastes as epoxy resin paste, acrylic resin paste and bismaleimide-triazine resin paste which are used in the die bonding process. The paste 10 has a decreased content of a volatile component (solvent) in order to bond the multi-wiring substrate 100 and the memory chip 2A with each other and the memory chip 2A and the microcomputer chip 2B with each other in a short time. Therefore, the viscosity of the paste 10 is very high (e.g., 800 to 1400 poise). In case of using the paste 10 of such a high viscosity, if the tip of the nozzle 43 is spaced too much from the surface of the multi-wiring substrate 100, the paste 10 of a high viscosity when discharged does not contact the multi-wiring substrate 100, but tends to stay on the tip of the nozzle 43 under surface tension. At this time, the distance from the tip of the nozzle 43 to the surface of the multi-wiring substrate 100 is 140 µm or more. As a result, a long time is required until the paste 10 is applied to the surface of the multi-wiring substrate 10 and hence the working efficiency is deteriorated. For applying the paste 10 of such a high viscosity to the surface of the multi-wiring substrate 100 quickly, it is required to lower the tip of the nozzle 43 to a distance at which the high viscosity paste 10 when discharged comes into contact with the surface of the multi-wiring substrate 100. In this embodiment, the tip of the nozzle 43 is approximated to a distance of, for example, 70 to 130 µm from the surface of the multi-wiring substrate 100 and in this state the paste is applied. On the other hand, in case of using paste lower in viscosity and more fluid than the paste 10 used in this embodiment, the application thereof can be done even when the distance from the tip of the nozzle 43 to the surface of the multi-wiring substrate 100 is, for example, 140 µm or more. However, since the paste in question is more fluid than the paste 10 used in this embodiment, it protrude from the chip-carrying region and may flow out up to the bonding pads. If the paste flows out to the bonding pads, the bonding may not be effected to a satisfactory extent. Moreover, if the paste viscosity is low, the paste curing time becomes longer and therefore the working efficiency is deteriorated.

An XY table 45, which is moved horizontally by a moving mechanism (not shown), is installed below the paste applicator 30.

For mounting the silicon chips (memory chip 2A and microcomputer chip 2B) onto the multi-wiring substrate 100 by means of the paste applicator 30, first the paste 10 is applied to each wiring substrate region on the multi-wiring substrate 100 in the following manner.

Figure 8:
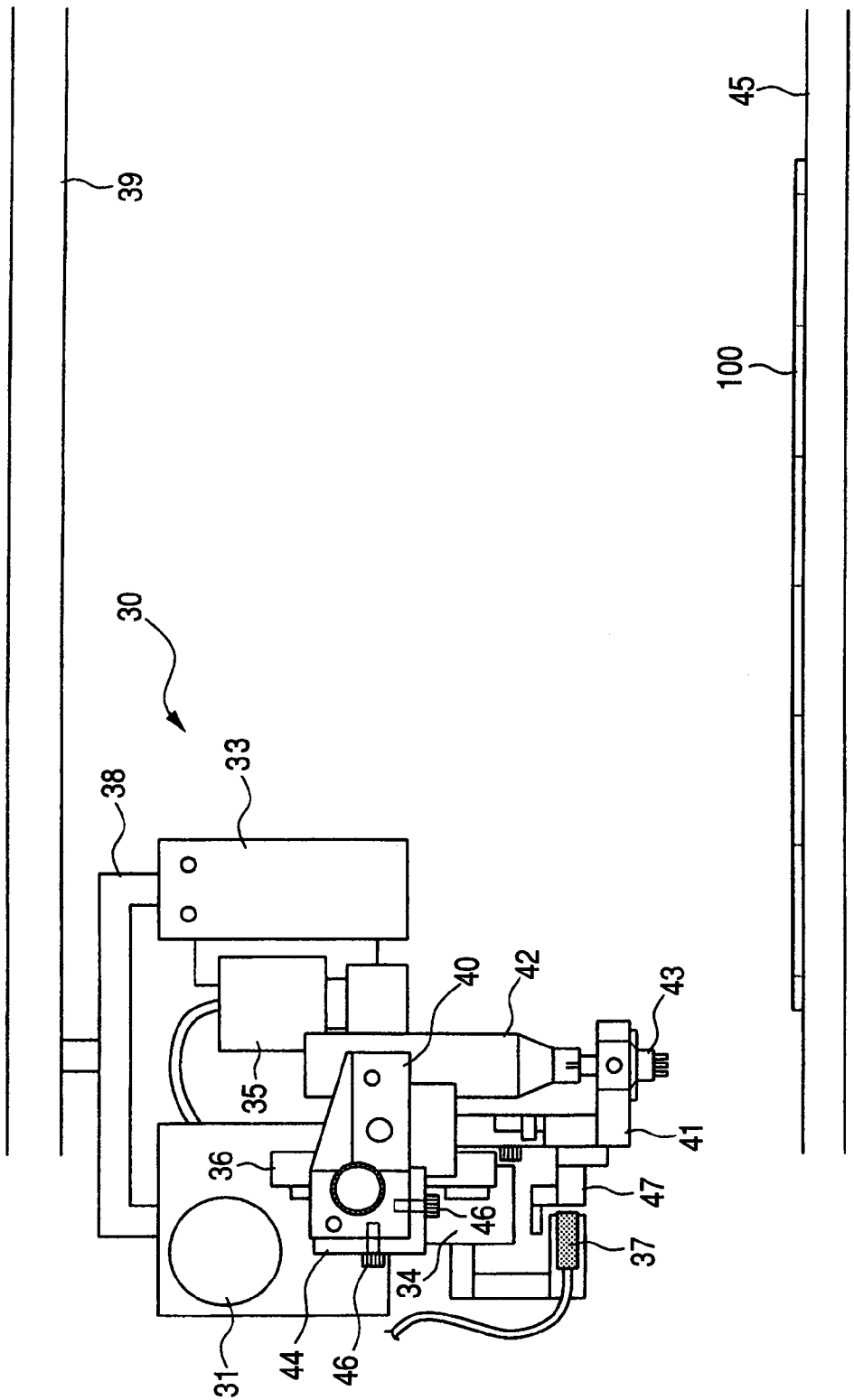
FIG. 8 is a schematic diagram illustrating a paste application method using the paste applicator.

For applying the paste 10 onto the surface of the multi-wiring substrate 100, the multi-wiring substrate 100 is put on an upper surface of the XY table 45, as shown in FIG. 8. The multi-wiring substrate 100 is positioned horizontally onto the XY table 45 with its main surface turned up. At this time, the paste applicator 30 stands by at an initial position above the XY table 45.

Figure 9:
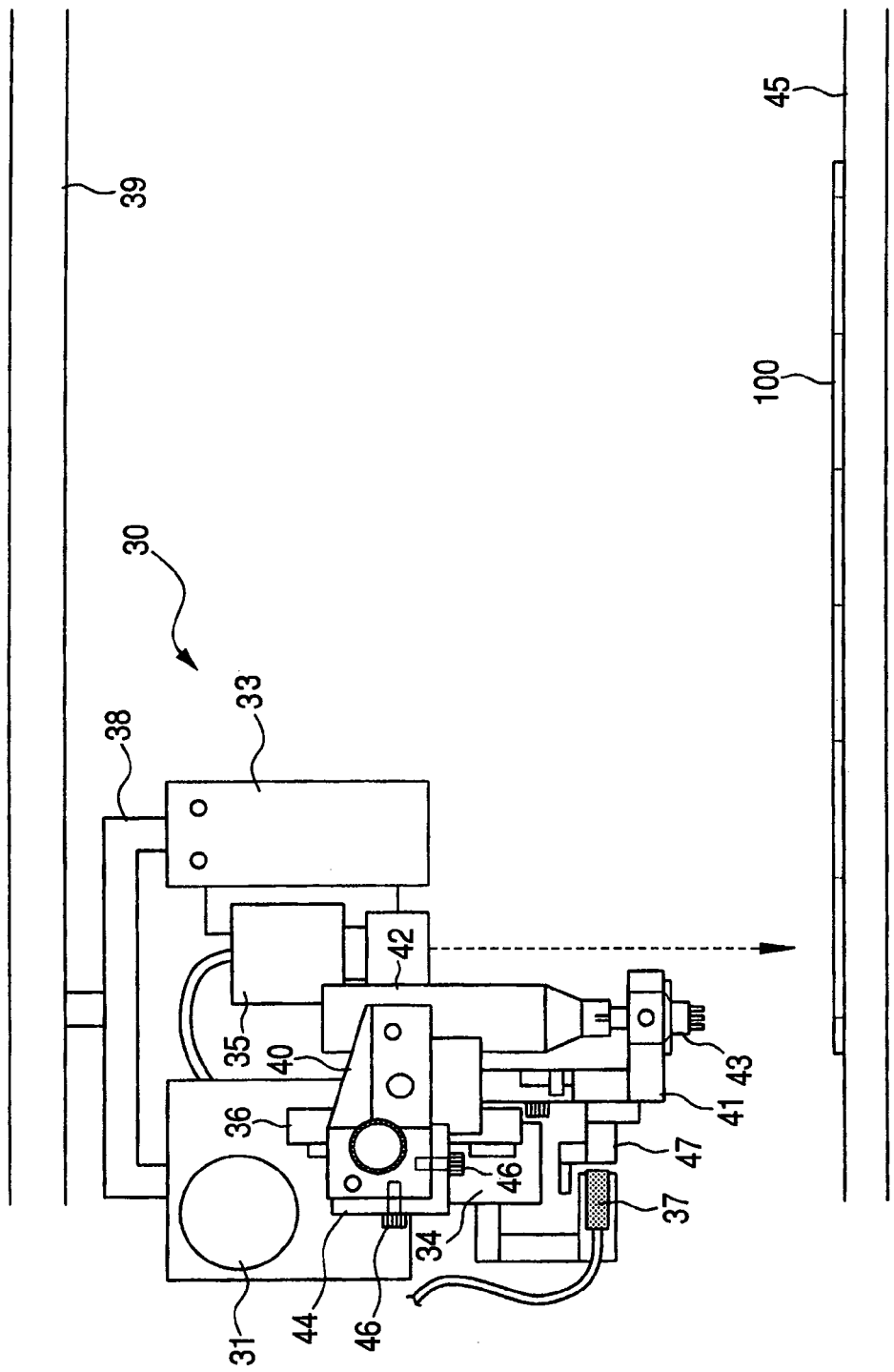
FIG. 9 is a schematic diagram illustrating the paste application method using the paste applicator.

Next, as shown in FIG. 9, the drive section of the paste application 30 is moved horizontally to a position above the multi-wiring substrate 100, and the position of a defect mark (not shown) and that of the wiring substrate region to be first applied with the paste 10 are detected using the camera 35. Position information of the defect mark detected by the camera 35 is inputted to a control section (not shown) in the paste applicator 30 to inhibit the application of the paste 10 to the wiring substrate region with the defect mark put thereon.

Figure 10:
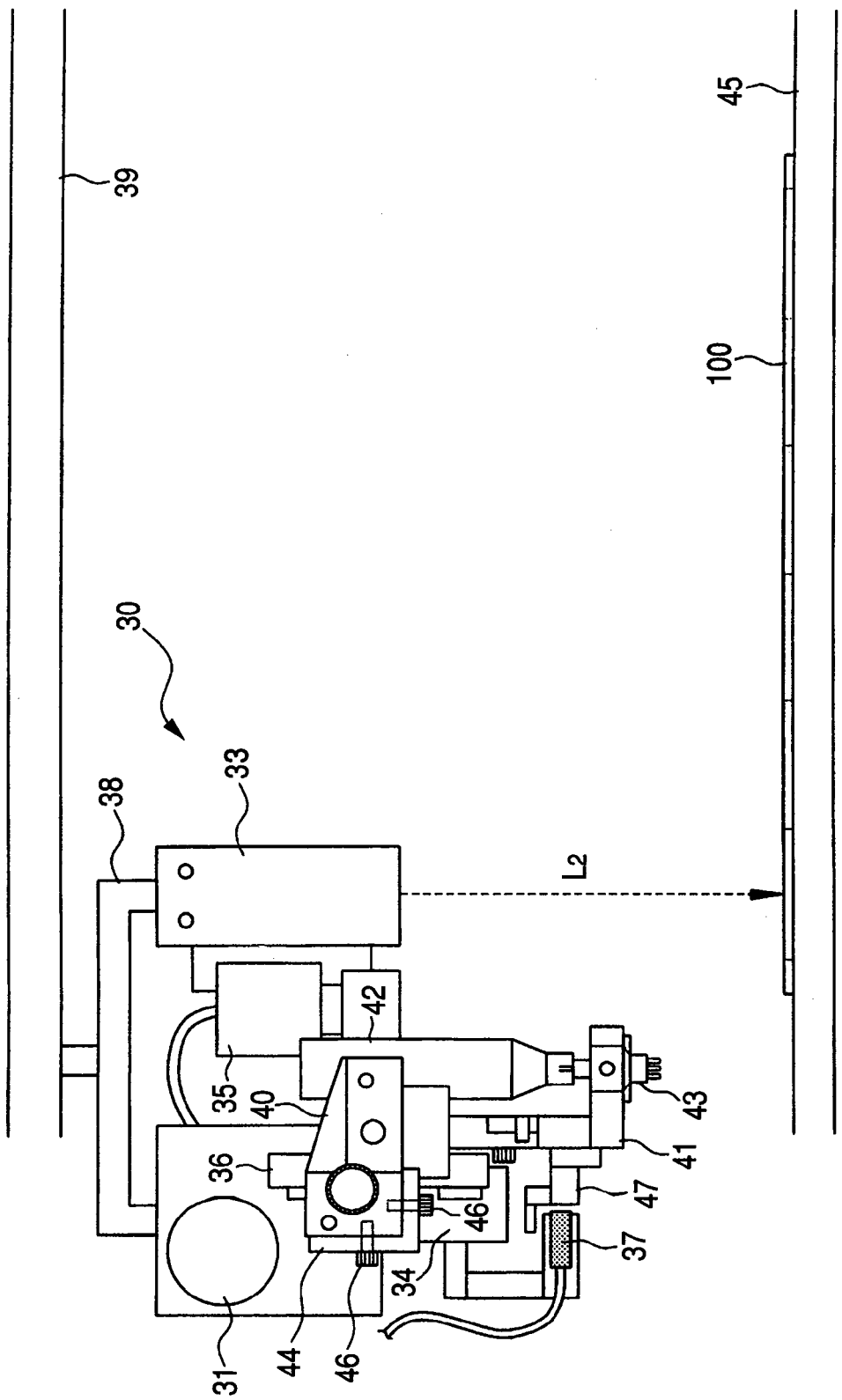
FIG. 10 is a schematic diagram illustrating the paste application method using the paste applicator.

Next, as shown in FIG. 10, the drive section is moved horizontally in accordance with the position information detected by the camera 35 to dispose the laser displacement meter 33 at a position above the wiring substrate region to which the paste 10 is to be applied first. Then, laser light is radiated from the laser displacement meter 33 to the wiring substrate region to be coated with the paste 10 and reflected light is detected to measure a vertical distance ($L_2$) from the laser displacement meter 33 to the wiring substrate region.

Figure 11:
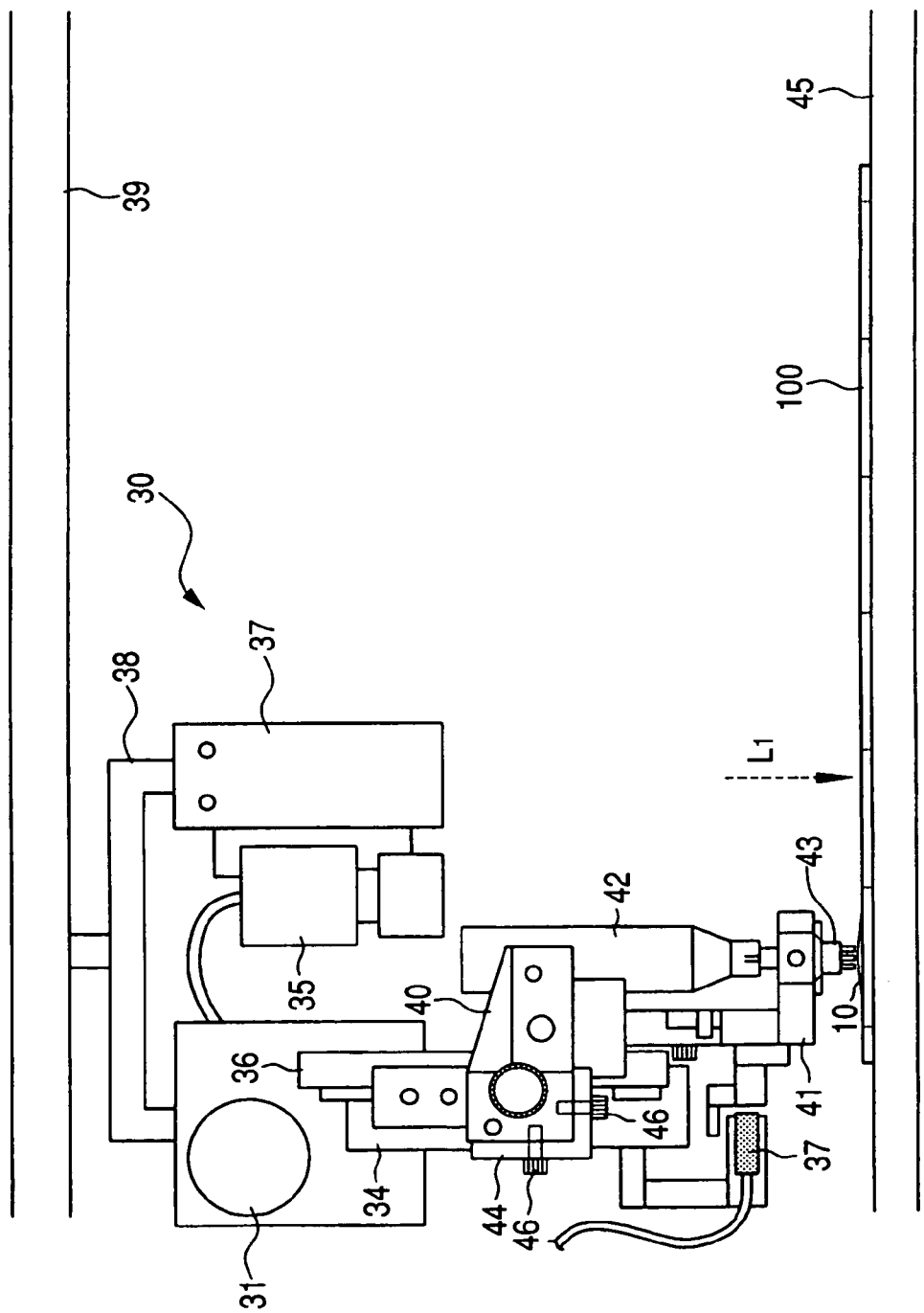
FIG. 11 is a schematic diagram illustrating the paste application method using the paste applicator.

Next, the drive section in the paste applicator 30 is moved horizontally to position the nozzle 43 above the wiring substrate region. Then, as shown in FIG. 11, the movable section is moved down by rotating the motor 31, allowing the tip of the nozzle 43 to contact the surface of the wiring substrate region. From this position the tip of the nozzle 43 is raised about 70 to 130 µm to determine a discharge position of the nozzle and thereafter the paste 10 is supplied from the nozzle tip to the surface of the wiring substrate region. The distance ($L_1$) at which the nozzle 43 has moved down from the stand-by position shown in FIG. 10 to the discharge position is measured accurately on the basis of the number of revolutions of the motor 31. This distance ($L_1$) and the foregoing distance ($L_2$) from the laser displacement meter 33 to the wiring substrate region are inputted to the control section in the paste applicator 30.

Figure 12:
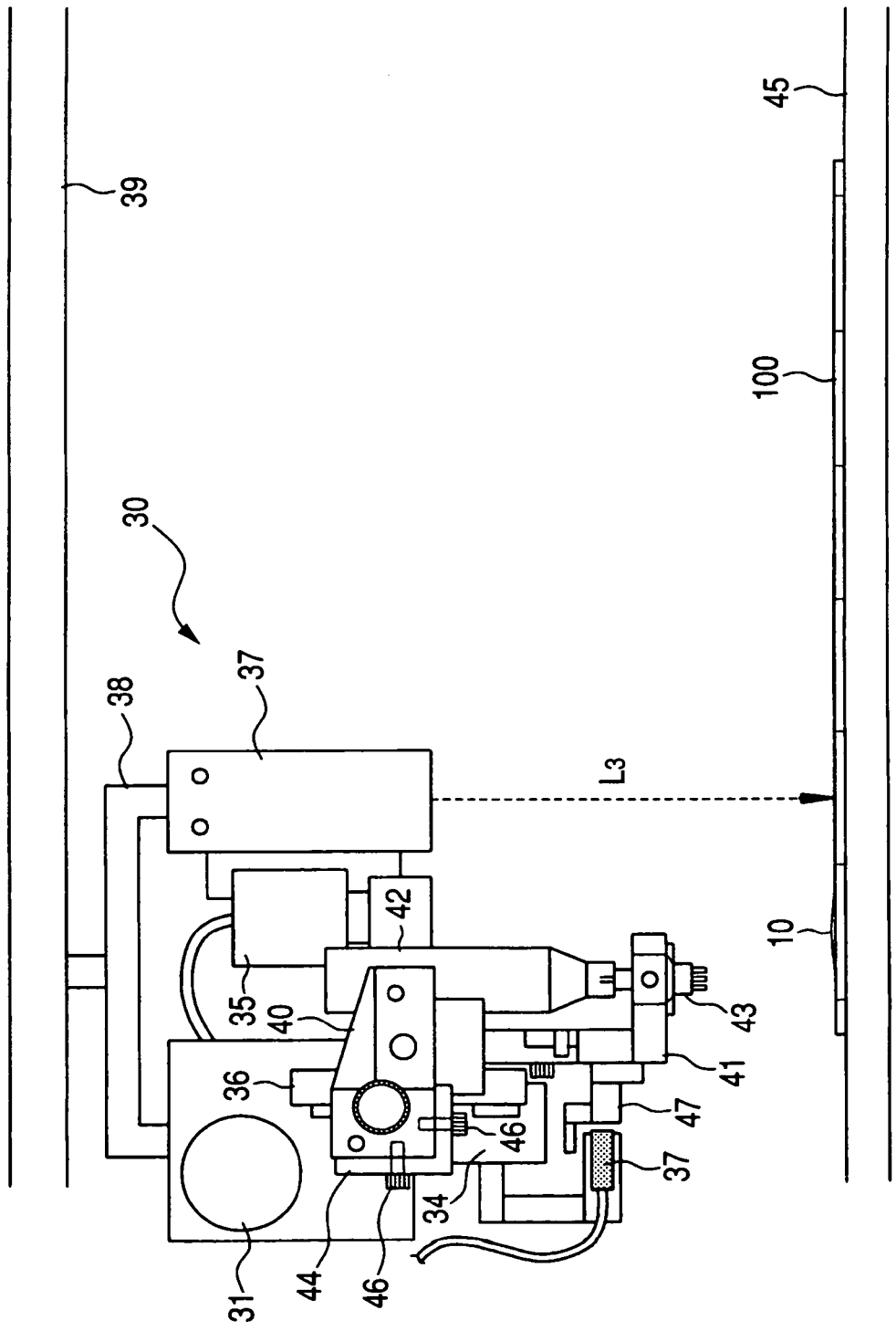
FIG. 12 is a schematic diagram illustrating the paste application method using the paste applicator.

Next, as shown in FIG. 12, the movable section is raised by the distance ($L_1$) up to the stand-by position and thereafter the drive section is moved horizontally to position the laser displacement meter 33 above a second wiring substrate region adjacent to the wiring substrate region coated with the paste 10. Then, laser light is radiated from the laser displacement meter 33 to the second wiring substrate region and reflected light is detected to measure a vertical distance ($L_3$) from the laser displacement meter 33 to the second wiring substrate region.

If the surface of the multi-wiring substrate 100 is flat, the distance ($L_3$) becomes equal to the distance ($L_2$) from the laser displacement meter 33 to the first wiring substrate region ($L_3=L_2$). In this case, therefore, the motor 31 is rotated by the same number of revolutions as that of the last time to let the movable section descend by the distance ($L_1$), whereby the tip of the nozzle 43 can be moved to a height (discharge position) of about 70 to 130 µm from the surface of the second wiring substrate region.

Figure 13:
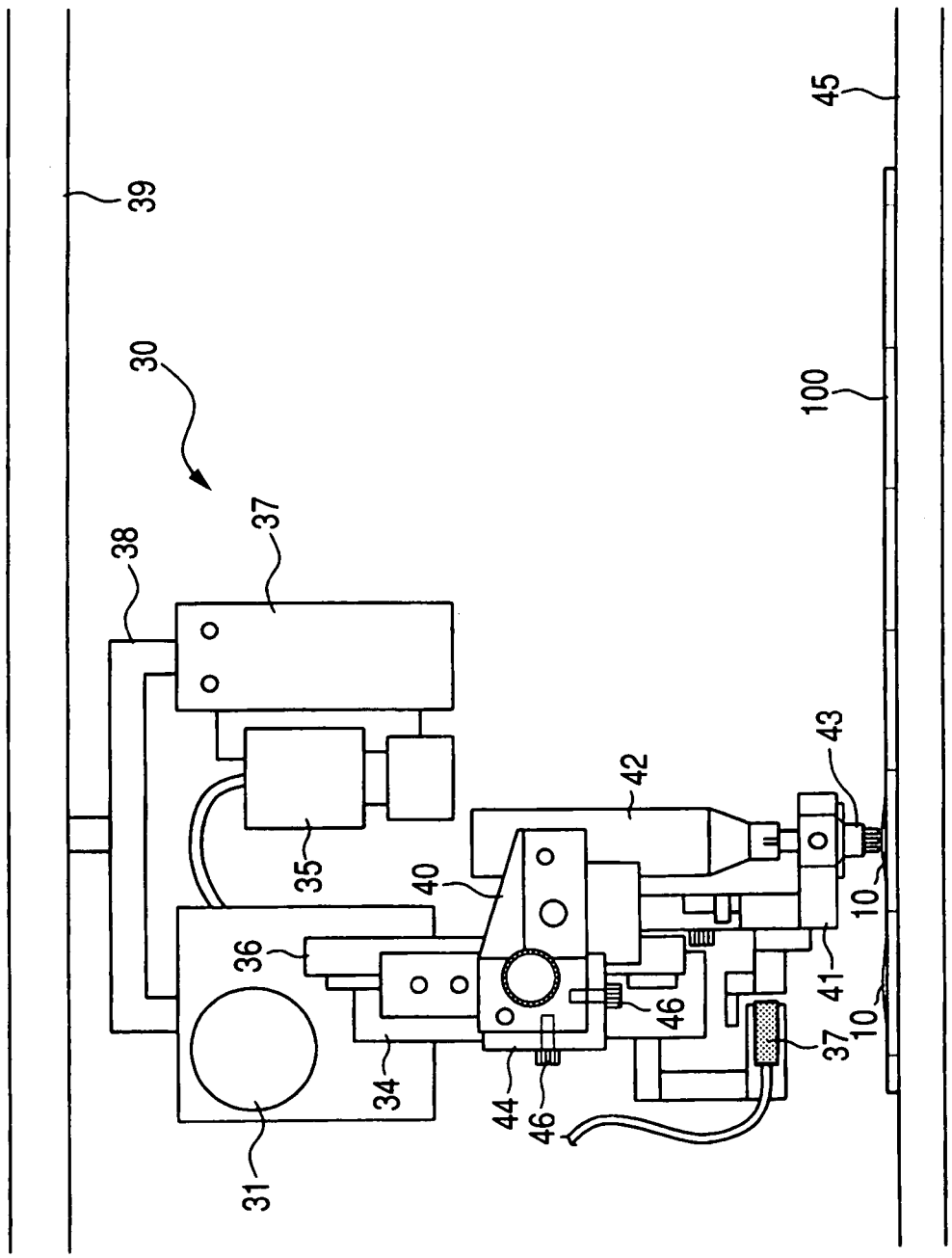
FIG. 13 is a schematic diagram illustrating the paste application method using the paste applicator.

However, since the surface of the multi-wiring substrate 100 is usually warped in the manufacturing process, there sometimes is a case where the distances ($L_3$) and ($L_2$) are not equal to each other. For example, when the surface of the second wiring substrate region is depressed by α with respect to the surface of the first wiring substrate region, the distance ($L_3$) becomes larger by α than the distance ($L_2$) ($L_3=L_2+\alpha$). In this case, therefore, the number of revolutions of the motor 31 is changed to let the movable section descend by the distance of ($L_1+\alpha$), whereby the tip of the nozzle 43 can be moved to a height (discharge position) of about 70 to 130 µm from the surface of the second wiring substrate region. In this way, the tip of the nozzle 43 is moved to the discharge position by correcting the descent distance ($L_1$) of the movable section on the basis of the difference between the distances $L_3$ and $L_2$. Then, as shown in FIG. 13, the paste 10 is supplied from the tip of the nozzle 43 to the second wiring substrate region. Thereafter, in the same way as above, the distance ($L_m$) from the laser displacement meter 33 to each of subsequent wiring substrate regions is measured and the paste 10 is applied to the wiring substrate regions on the multi-wiring substrate 100 in order while correcting the descent distance ($L_1$) of the movable section on the basis of the difference between the distance ($L_m$) and the reference distance ($L_2$).

Next, the memory chip 2A is mounted in the following manner onto each of the wiring substrate regions on the multi-wiring substrate 100 thus coated with the paste 10.

Figure 14:
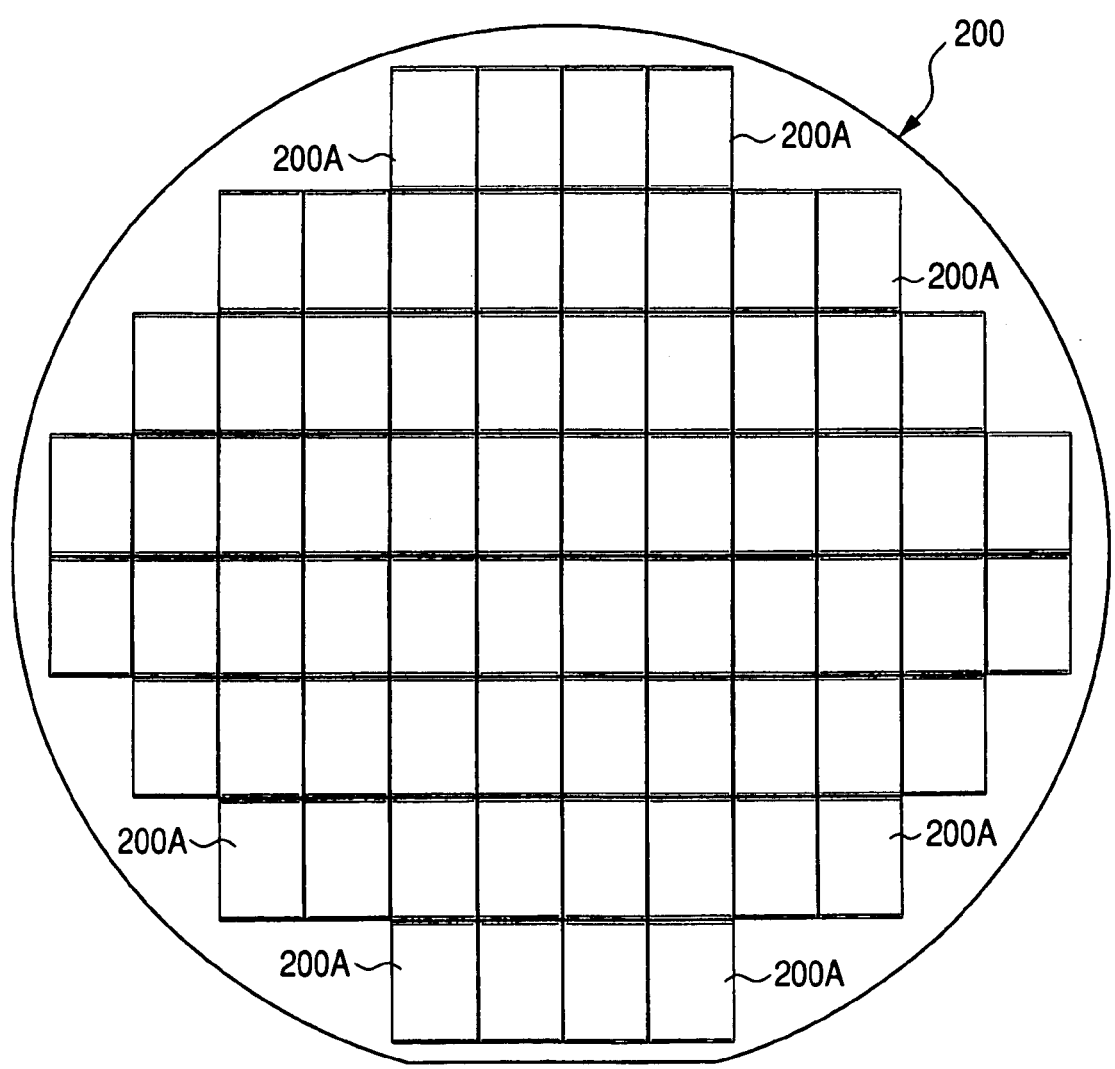
FIG. 14 is a plan view of a semiconductor wafer used in manufacturing the stacked BGA.

First, a wafer 200 formed by a single crystal silicon is provided as shown in FIG. 14. A flash memory circuit is formed in each of chip-forming regions 200A on a main surface of the wafer 200 in accordance with a known semiconductor device manufacturing process. The flash memory circuit formed in each chip-forming region 200A is checked for quality by an electric test which is conducted in the final stage of the semiconductor device manufacturing process.

Figure 15:
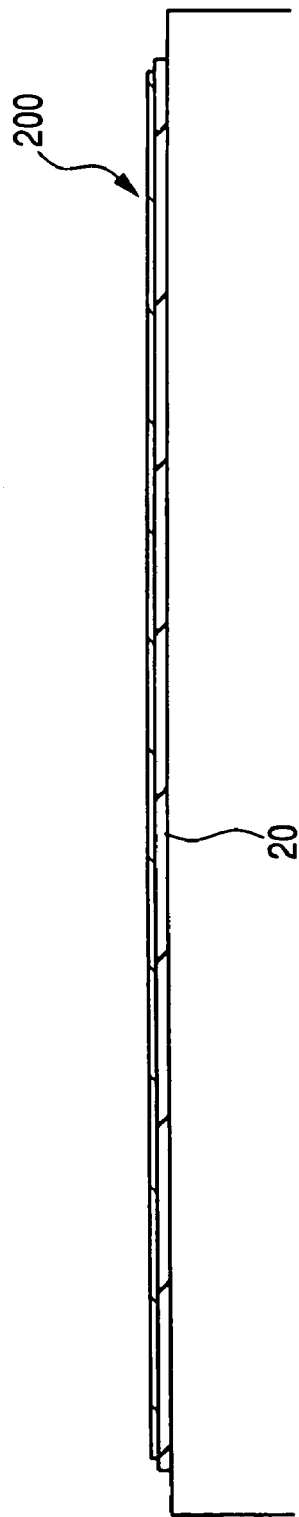
FIG. 15 is a schematic diagram illustrating a dicing process for the semiconductor wafer used in manufacturing the stacked BGA.

Next, as shown in FIG. 15, a back grinding tape 20 or circuit protection is affixed to the main surface (lower surface side in the figure) of the wafer 200. In this state, a back surface (upper surface side in the figure) of the wafer 200 is subjected to grinding with use of a grinder to thin the wafer 200 to about 100 μm.

Figure 16:
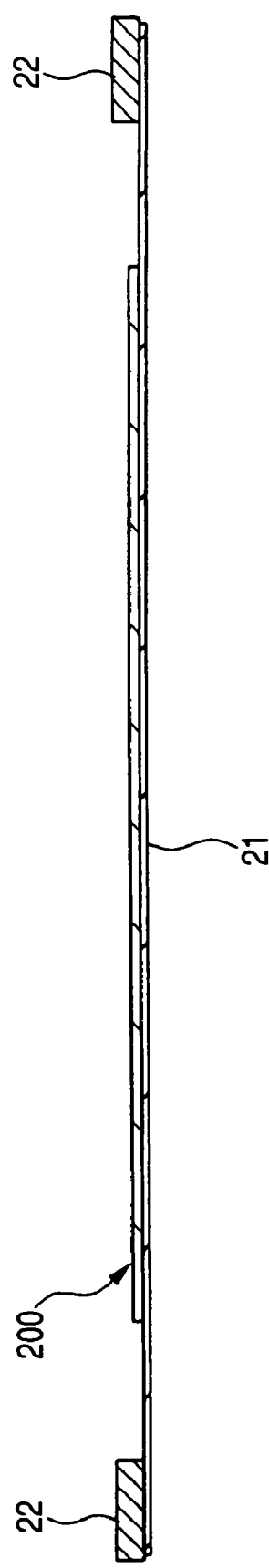
FIG. 16 is a schematic diagram illustrating the dicing process for the semiconductor wafer used in manufacturing the stacked BGA.

Next, the back grinding tape 20 is removed. Thereafter, as shown in FIG. 16, a dicing tape 21 is affixed to the back surface of the wafer 200 and in this state a peripheral portion of the dicing tape 21 is fixed to a wafer ring 22. The dicing tape 21 is obtained by circularly cutting out a UV curing type pressure-sensitive adhesive tape which tape has been given tackiness by applying a pressure-sensitive adhesive to the surface of a tape base material such as polyolefin (PO), polyvinyl chloride (PVC), or polyethylene terephthalate (PET).

Figure 17:
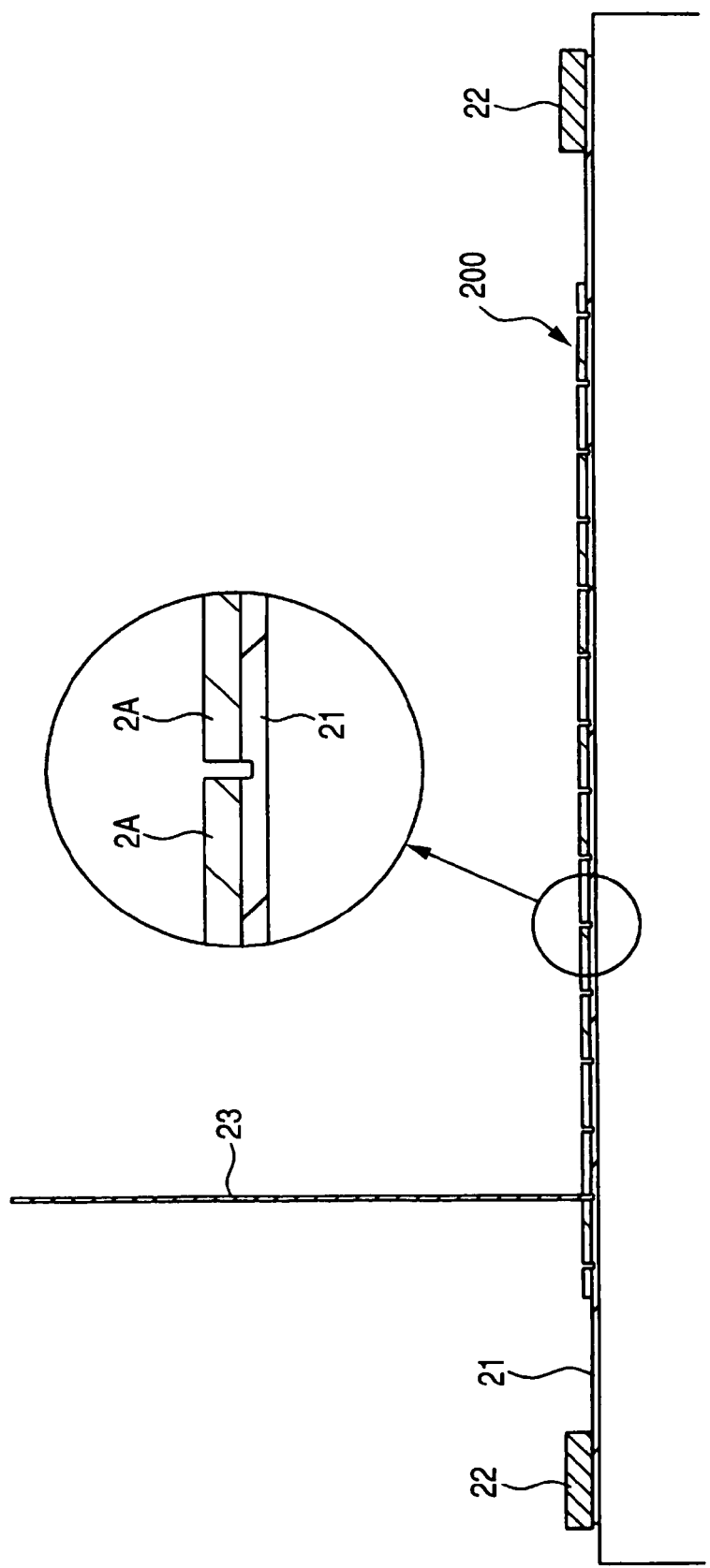
FIG. 17 is a schematic diagram illustrating the dicing process for the semiconductor wafer used in manufacturing the stacked BGA.

Next, as shown in FIG. 17, the wafer 200 is diced using a known dicing blade 23, whereby the plural chip-forming regions 200A are divided into respective rectangular memory chips 2A. At this time, the dicing tape 21 is cut only about half in its thickness direction, allowing the divided memory chips 2A to remain on the circular dicing tape 21. In case of using a UV curing type pressure-sensitive adhesive tape as the dicing ape 21, ultraviolet light is radiated to the dicing tape 21 prior to the process of separating the memory chips 2A from the dicing tape 21, thereby weakening the adhesion of the pressure-sensitive adhesive applied to the surface of the dicing tape.

Figure 18:
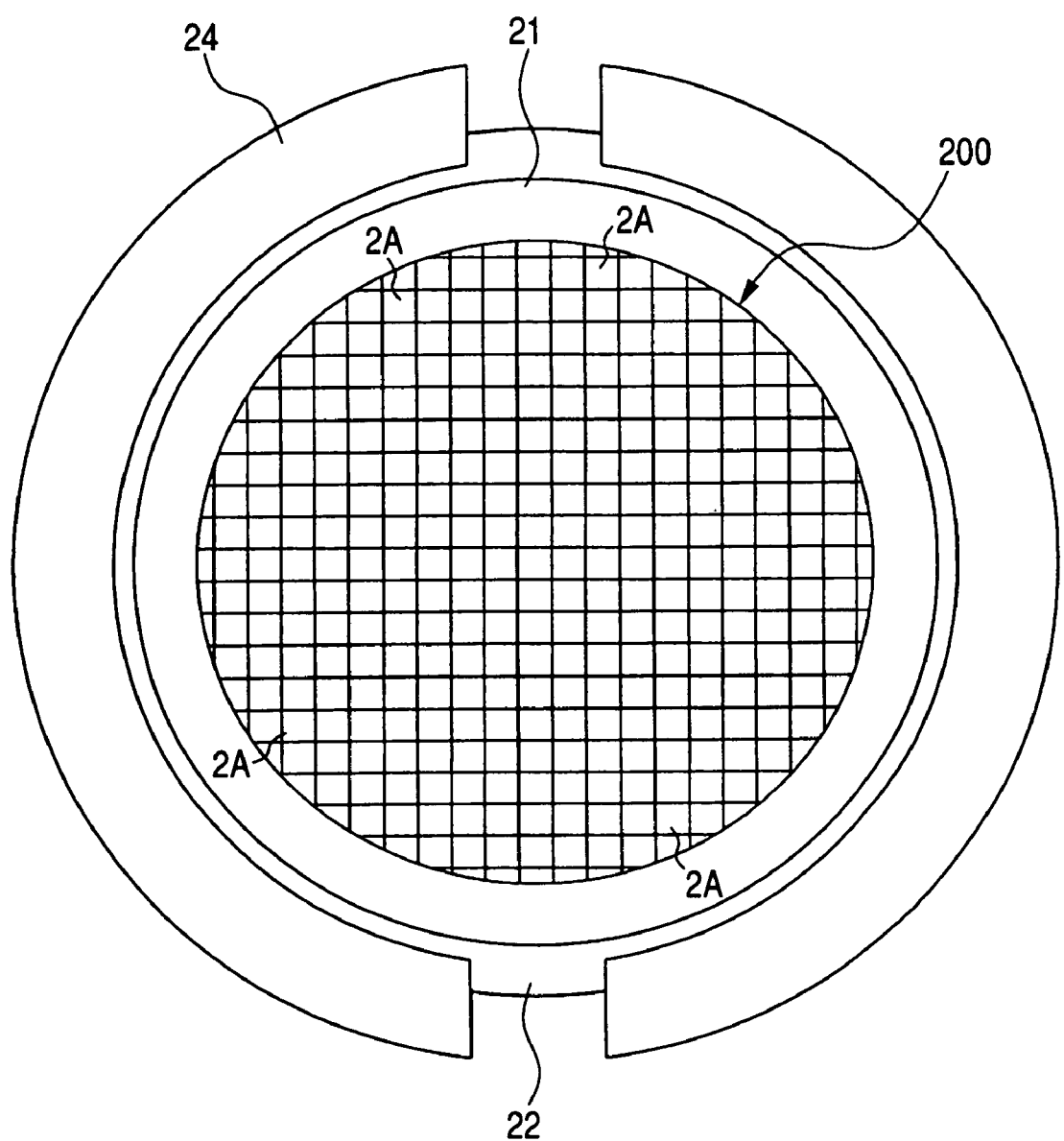
FIG. 18 is a schematic diagram illustrating the dicing process for the semiconductor wafer used in manufacturing the stacked BGA.
Figure 19:
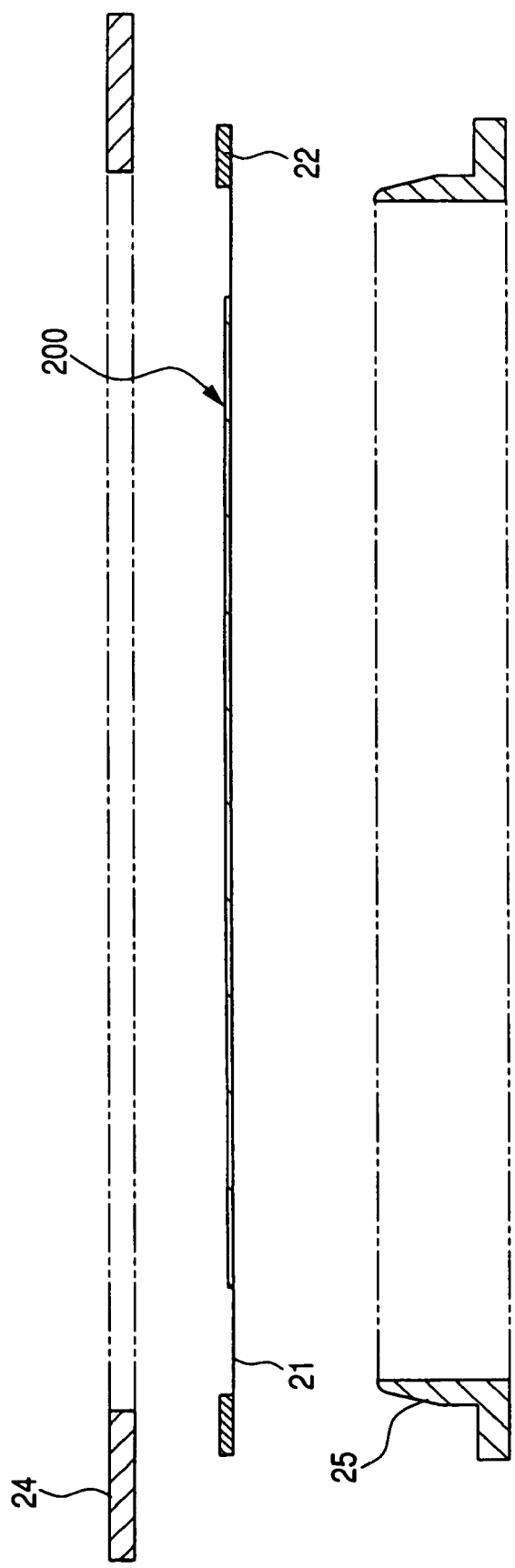
FIG. 19 is a schematic diagram illustrating the dicing process for the semiconductor wafer used in manufacturing the stacked BGA.
Figure 20:
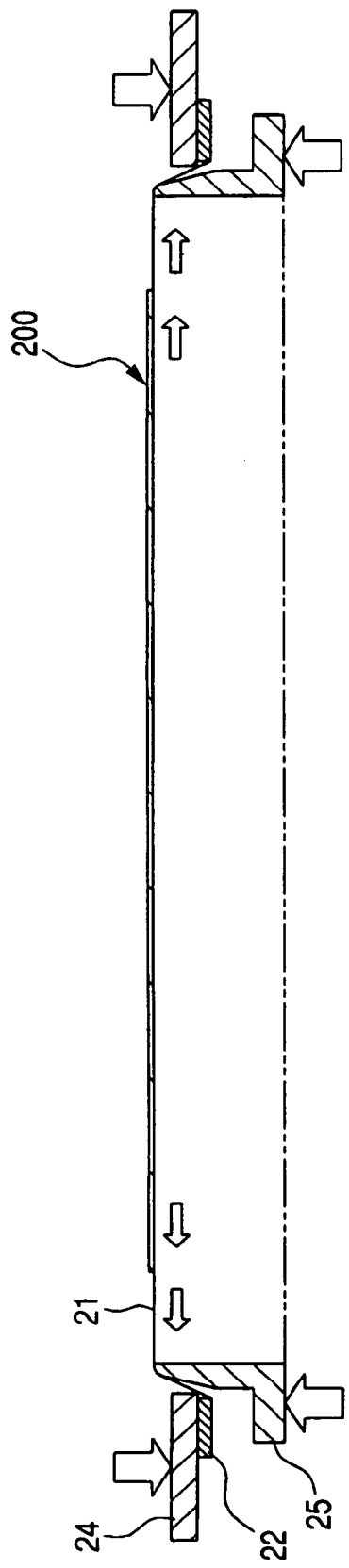
FIG. 20 is a schematic diagram illustrating the dicing process for the semiconductor wafer used in manufacturing the stacked BGA.

Next, as shown in FIG. 18 (plan view) and FIG. 19 (sectional view), presser plates 24 are disposed above the dicing tape 21 fixed to the wafer ring 22 and an expand ring 25 is disposed below the dicing tape. Then, as shown in FIG. 20, the presser plates 24 are pushed against an upper surface of the wafer ring 22 and at the same time a peripheral portion of a back surface of the dicing tape 21 is pushed upward by the expand ring 25. By so doing, the dicing tape 21 undergoes a strong tension acting from the central portion toward the peripheral portion and is therefore stretched horizontally without looseness.

Figure 21:
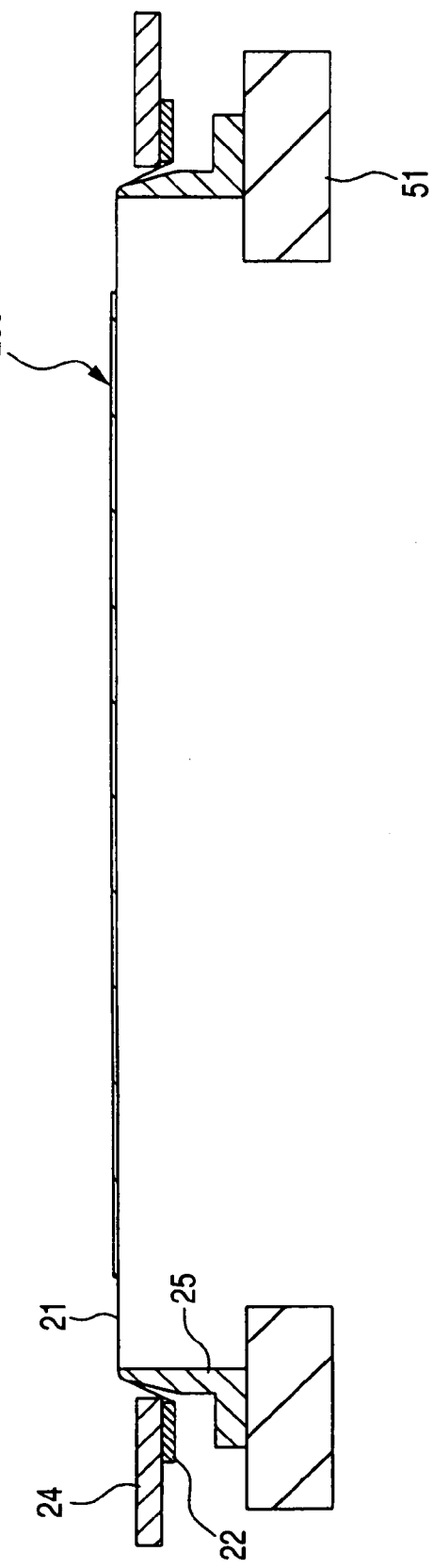
FIG. 21 is a schematic diagram illustrating the dicing process for the semiconductor wafer used in manufacturing the stacked BGA.
Figure 22:
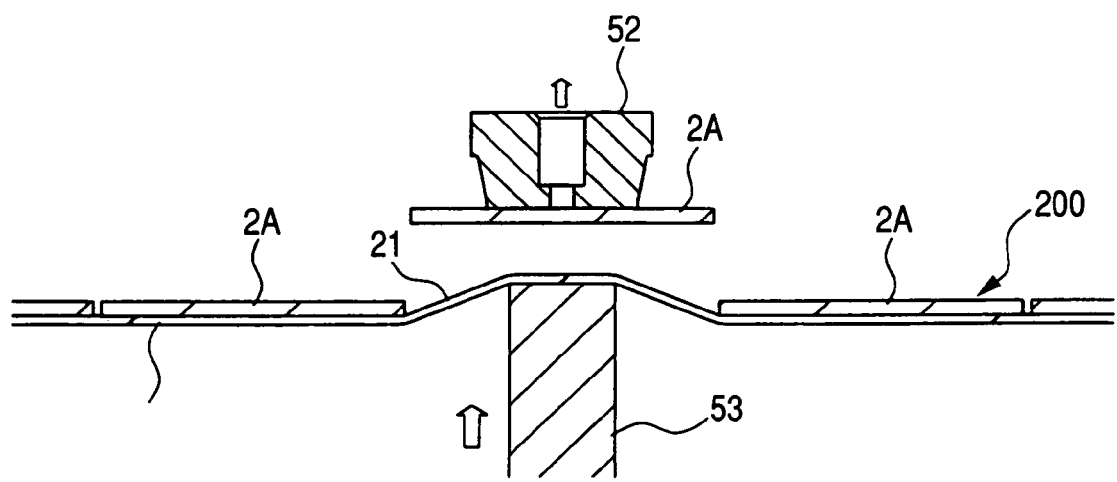
FIG. 22 is a schematic diagram illustrating the dicing process for the semiconductor wafer used in manufacturing the stacked BGA.

In this state, the expand ring 25 is positioned on a stage 51 of a chip peeling apparatus shown in FIG. 21 and the dicing tape 21 is held horizontally. Then, as shown in FIG. 22, the main surface (upper surface) of the memory chip 2A to be peeled is held by a chuck collet 52 and a stick-up pin 53 is pushed against a lower surface portion of the dicing tape 21 to which the memory chip 2A concerned is affixed, whereby the memory chip 2A is peeled off from the dicing tape 21.

Figure 23:
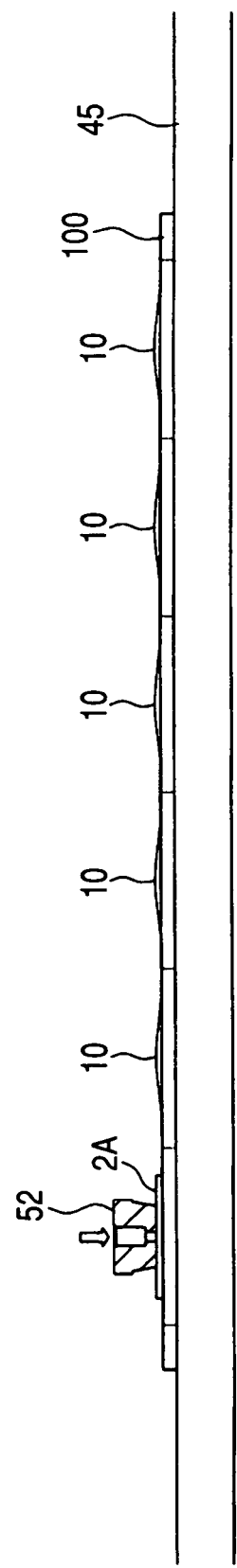
FIG. 23 is a schematic diagram illustrating the dicing process for the semiconductor wafer used in manufacturing the stacked BGA.
Figure 24:
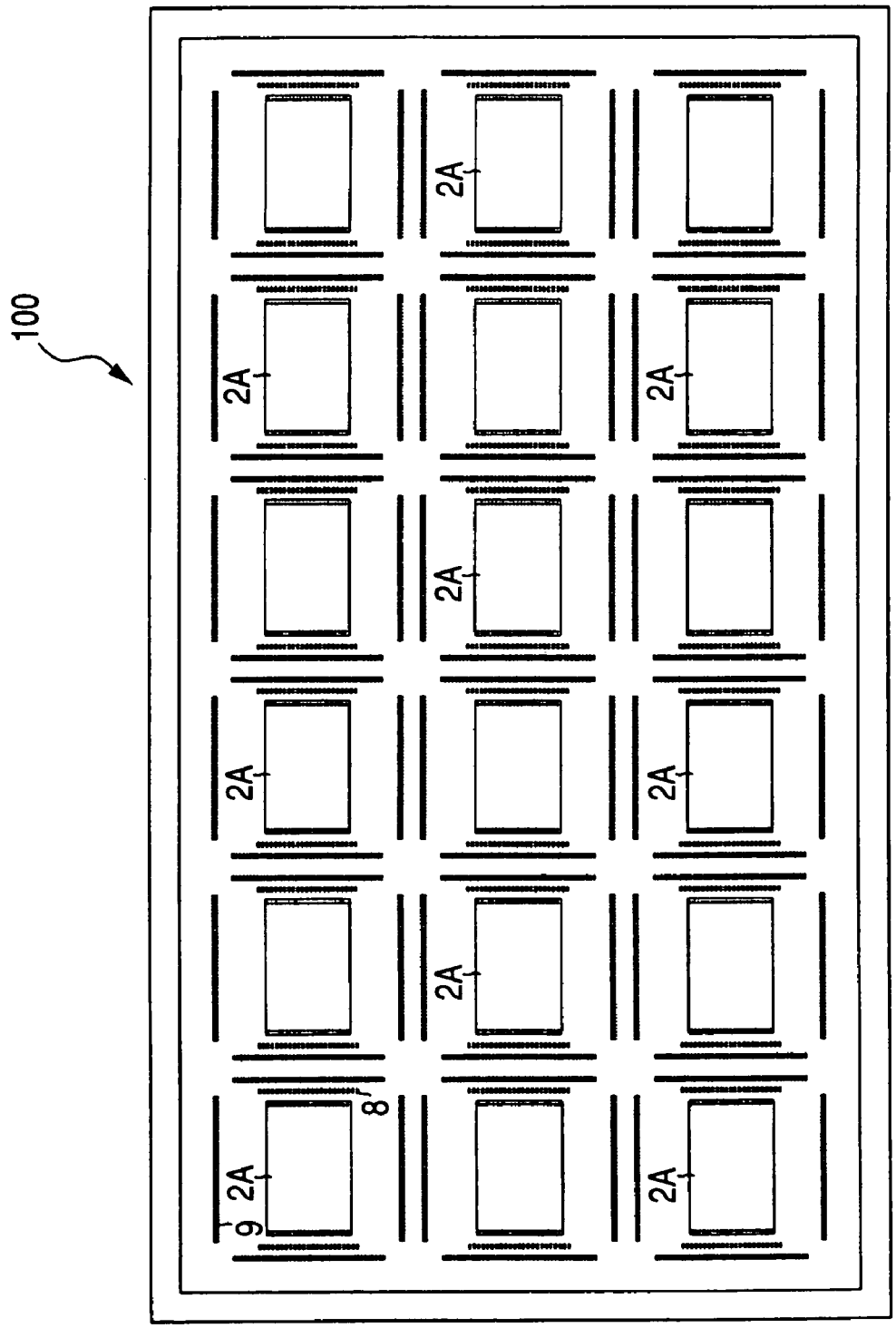
FIG. 24 is a plan view of a multi-wiring substrate, illustrating the paste application method using the paste applicator.

The memory chip 2A thus peeled off from the dicing tape 21 is conveyed onto the XY table 45 of the paste applicator 30 by the moving mechanism (not shown) while being held by the chuck collet 52. Then, as shown in FIG. 23, the chuck collet 52 is moved down to push a lower surface of the memory chip 2A against the surface of the paste 10 applied to the wiring substrate regions on the multi-wiring substrate 100, thereby bonding the memory chip 2A to the surface of the multi-wiring substrate 100. Subsequently, by repeating the operations shown in FIGS. 22 and 23, the remaining memory chips 2A are peeled off one by one from the dicing tape 21 and are mounted one by one onto the wiring substrate regions on the multi-wiring substrate 100 (FIG. 24).

Next, using the paste applicator 30 and in the manner described above, the paste 10 is applied to the surface of each memory chip 2A mounted on the multi-wiring substrate 100.

Figure 25:
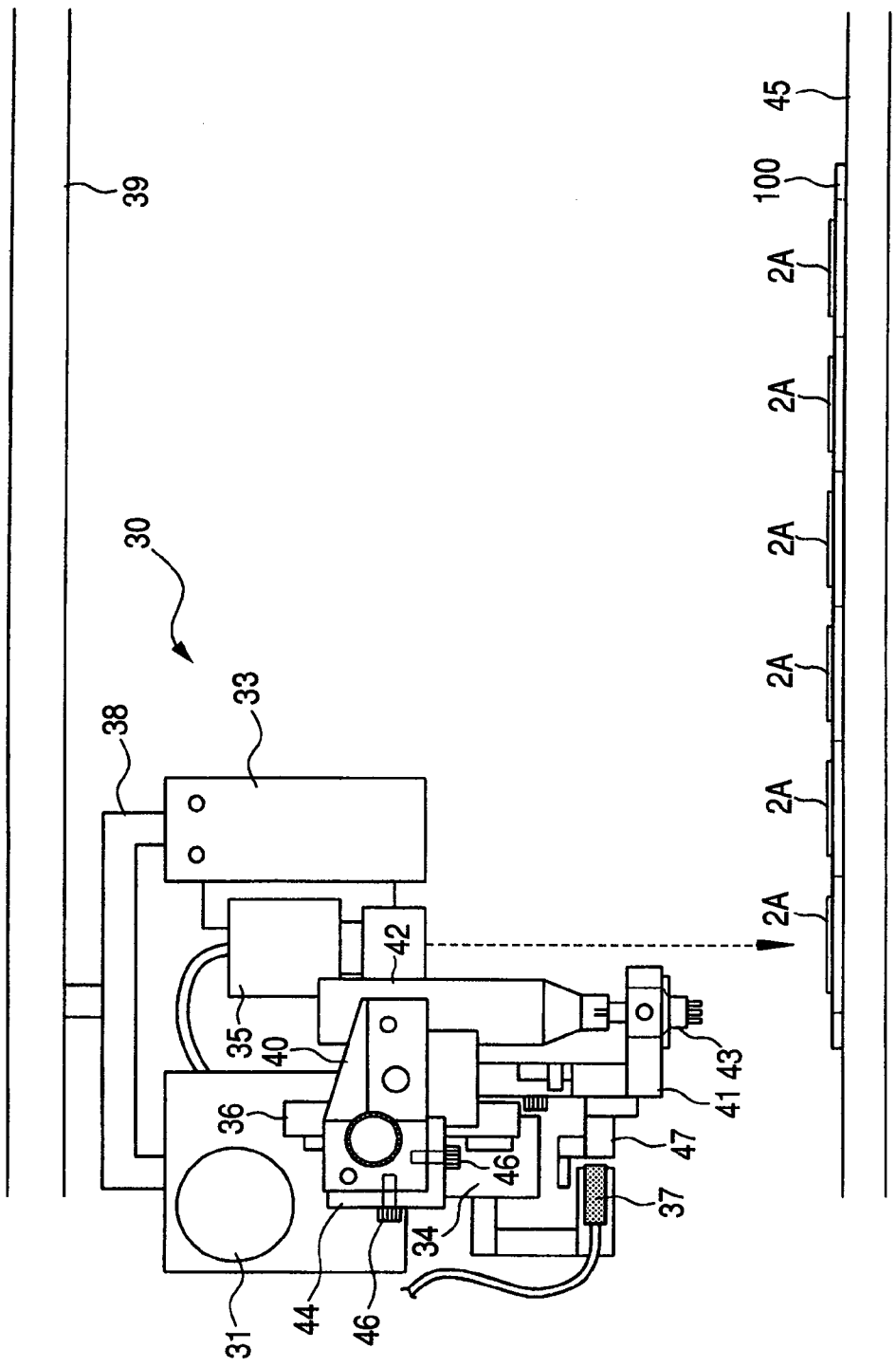
FIG. 25 is a schematic diagram illustrating the paste application method using the paste applicator.

For applying the paste 10 to the surface of each memory chip 2A, first as shown in FIG. 25, the drive section in the paste applicator 30 is horizontally moved to above the multi-wiring substrate 100 and the position of the memory chip 2A (the left-end memory chip 2A in the figure) to be first subjected to distance measurement is detected by the camera 35.

Figure 26:
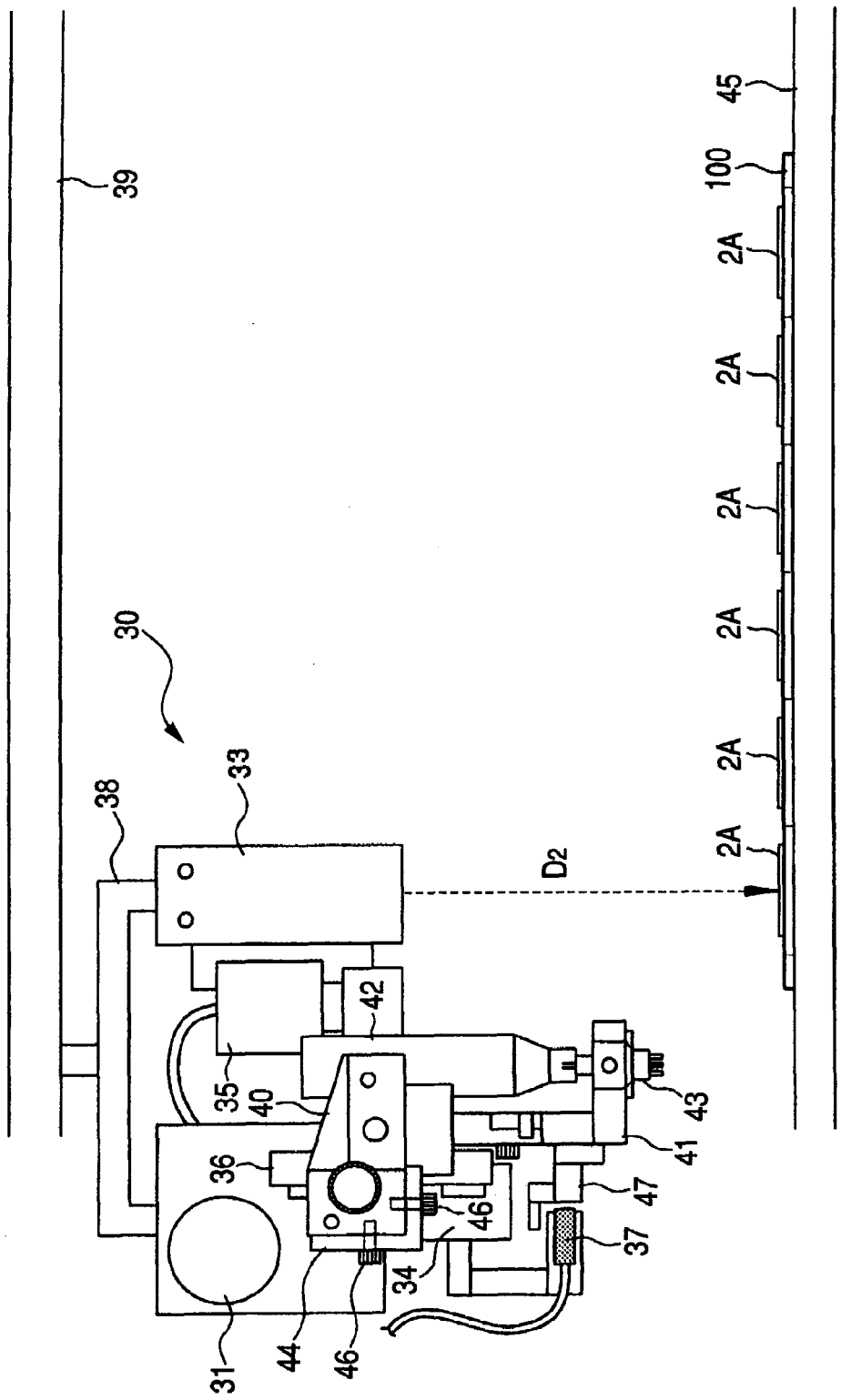
FIG. 26 is a schematic diagram illustrating the paste application method using the paste applicator.

Next, as shown in FIG. 26, the drive section is moved horizontally in accordance with the above position information detected by the camera 35 to position the laser displacement meter 33 above the memory chip 2A to be first subjected to distance measurement. Then, laser light is radiated to the surface of the memory chip 2A from the laser displacement meter 33 and reflected light is detected to measure a vertical distance ($D_2$, A) from the laser displacement meter 33 to the surface of the memory chip 2A.

Figure 27:
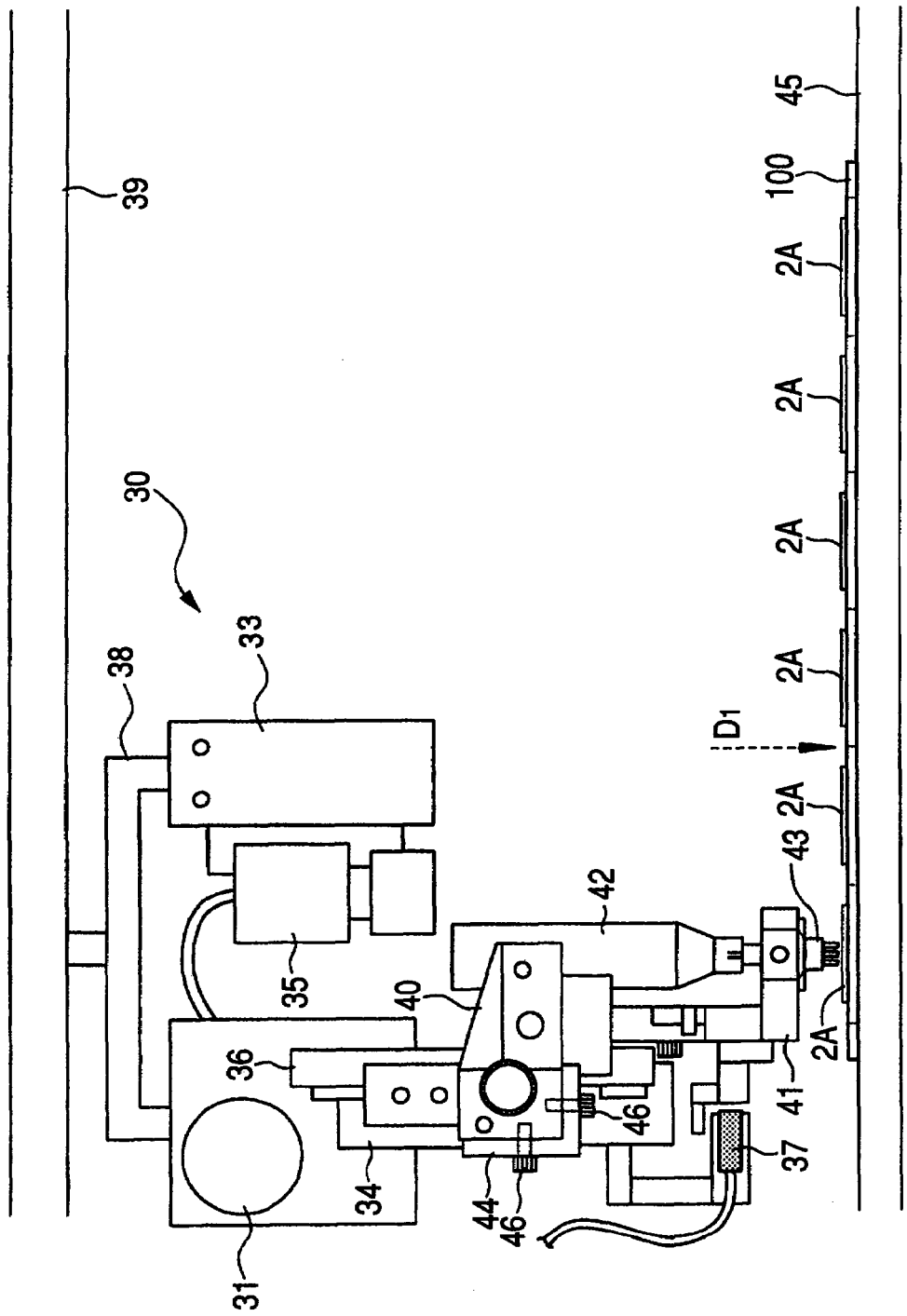
FIG. 27 is a schematic diagram illustrating the paste application method using the paste applicator.

Then, the drive section is moved horizontally to position the nozzle 43 above the memory chip 2A and, as shown in FIG. 27, the motor 31 is rotated to bring down the movable section of the paste applicator 30 so that the tip of the nozzle 43 comes into contact with the surface of the memory chip 2A. The tip of the nozzle 43 is then raised about 70 to 130 μm from this position to determine a discharge position of the nozzle. A descent distance ($D_1$) of the nozzle 43 to the discharge position from the stand-by position shown in FIG. 26 is measured accurately on the basis of the number of revolutions of the motor 31. This distance ($D_1$) and the foregoing distance ($D_2$) from the laser displacement meter 33 to the memory chip 2A are inputted to the control section in the paste applicator 30.

When measuring the distance ($D_1$), the tip of the nozzle 43 is once contacted with the surface of the memory chip 2A, so that the circuit formed on the memory chip 2A is damaged. Therefore, for measuring the reference distances ($D_1$, $D_2$) it is preferable to use a dummy chip 2A' instead of the memory chip 2A. As the dummy chip 2A' there is used, for example, a memory chip 2A which has been judged to be defective in the electric test and which is not used as a product chip, out of the plural memory chips 2A obtained from the wafer 200 shown in FIG. 14. The following description is provided about the case where the reference distances ($D_1$, $D_2$) are measured using the dummy chip 2A'.

Next, the movable section of the paste applicator 30 is raised by the distance ($D_1$, B) and is thereby returned from the discharge position to the stand-by position. Thereafter, the drive section is moved horizontally to position the laser displacement meter 33 above the second memory chip 2A adjacent to the dummy chip 2A' which has been used in measuring the distances ($D_1$, $D_2$). Then, laser light radiated to the surface of the memory chip 2A from the laser displacement meter 33 and reflected light is detected to measure a vertical distance ($D_3$, A') from the laser displacement meter 33 to the surface of the memory chip 2A. Then, in accordance with the method described above in connection with the process shown in FIG. 12, a distance (B') as a corrected distance of the descent distance ($D_1$) of the movable section is calculated on the basis of the difference between the distance ($D_3$) and the reference distance ($D_2$).

The above method of correcting the descent distance ($D_1$) of the movable section on the basis of the difference between the distances ($D_3$) and ($D_2$) premises that the distance from the laser displacement meter 33 to the nozzle 43 at the time of having measured the distance ($D_2$) from the laser displacement meter 33 to the dummy chip 2A' and the distance from the laser displacement meter 33 to the nozzle 43 at the time of having measured the distance ($D_3$) from the laser displacement meter 33 to the second memory chip 2A (adjacent to the dummy chip 2A') are equal to each other. That is, this correction method premises that a relative position of the movable section with respect to the drive section is constant no matter in which memory chip 2A discharge position the nozzle 43 may lie.

However, as described above, the movable section in the paste applicator 30 is supported by the drive section in a state in which the L block 44 and the holder body 40, the holder body 40 and the nozzle holder 41, and the nozzle holder 41 and the nozzle 43, are respectively fixed together with screws. Therefore, as the paste 10 is applied successively to the surfaces of the memory chips 2A on the multi-wiring substrate 100 while the movable section repeats its vertical movements, there occurs a positional deviation between the drive section and the movable section or between the components of the movable section, due to loosening of the screws for example, so that the distance between the nozzle 43 positioned at the lowest end of the movable section and the drive section becomes larger gradually.

Therefore, if the paste 0 is applied successively to the surfaces of the memory chips 2A while measuring the distance ($D_m$) from the laser displacement meter 33 to the surface of each memory chip 2A and correcting the descent distance ($D_1$) on the basis of the difference between the distance ($D_m$) and the reference distance ($D_2$), the discharge position of the nozzle 43 gradually approaches the surface of the memory chip 2A concerned and finally the tip of the nozzle 43 comes into contact with the surface of the memory chip 2A, causing damage to the circuit.

Such a positional deviation with time of the movable section relative to the drive section can occur also when applying the paste 10 successively to the wiring substrate regions on the multi-wiring substrate 100. However, since the surfaces of the wiring substrate regions on the multi-wiring substrate 100 are covered with solder resist 14, there will be no trouble even upon contact of the nozzle tip with each wiring substrate region. On the other hand, in the case of each memory chip 2A, if the tip of the nozzle 43 contacts the surface of the memory chip, the circuit formed on the chip will be damaged. If the paste is applied while spacing the tip of the nozzle 43 away from the surface of the memory chip 2A at a distance of, for example, 140 μm or more for avoiding contact of the nozzle tip with the memory chip surface, then in the case of such a high viscosity paste 10 as that used in this embodiment, a long time is required until the paste 10 is applied to the surface of the memory chip 2A as noted earlier, thus resulting in that the working efficiency is deteriorated.

To avoid such an inconvenience, in this embodiment, as will be described below, a positional deviation quantity (C) with time of the movable section relative to the drive section is detected using the height sensor 37 fixed to the main shaft support portion 34 in the drive section and the descent distance ($D_1$) of the movable section is again corrected on the basis of the positional deviation quantity to calculate the distance (B').

The detection of the positional deviation quantity (C) by the height sensor 37 is performed for each of the wiring substrate regions, whereby the contact of the tip of the nozzle 43 with the memory chip 2A concerned can be monitored at all times and the height of the nozzle 43 can be adjusted at every occurrence of the positional deviation. Consequently, the amounts of the paste 10 applied to plural wiring substrate regions can be controlled almost uniformly.

By detecting the positional deviation quantity (C) when the paste application process has been completed ten times for example, without detecting it at every end of the application process, the working efficiency can be improved over that in every-time detection.

Figure 28:
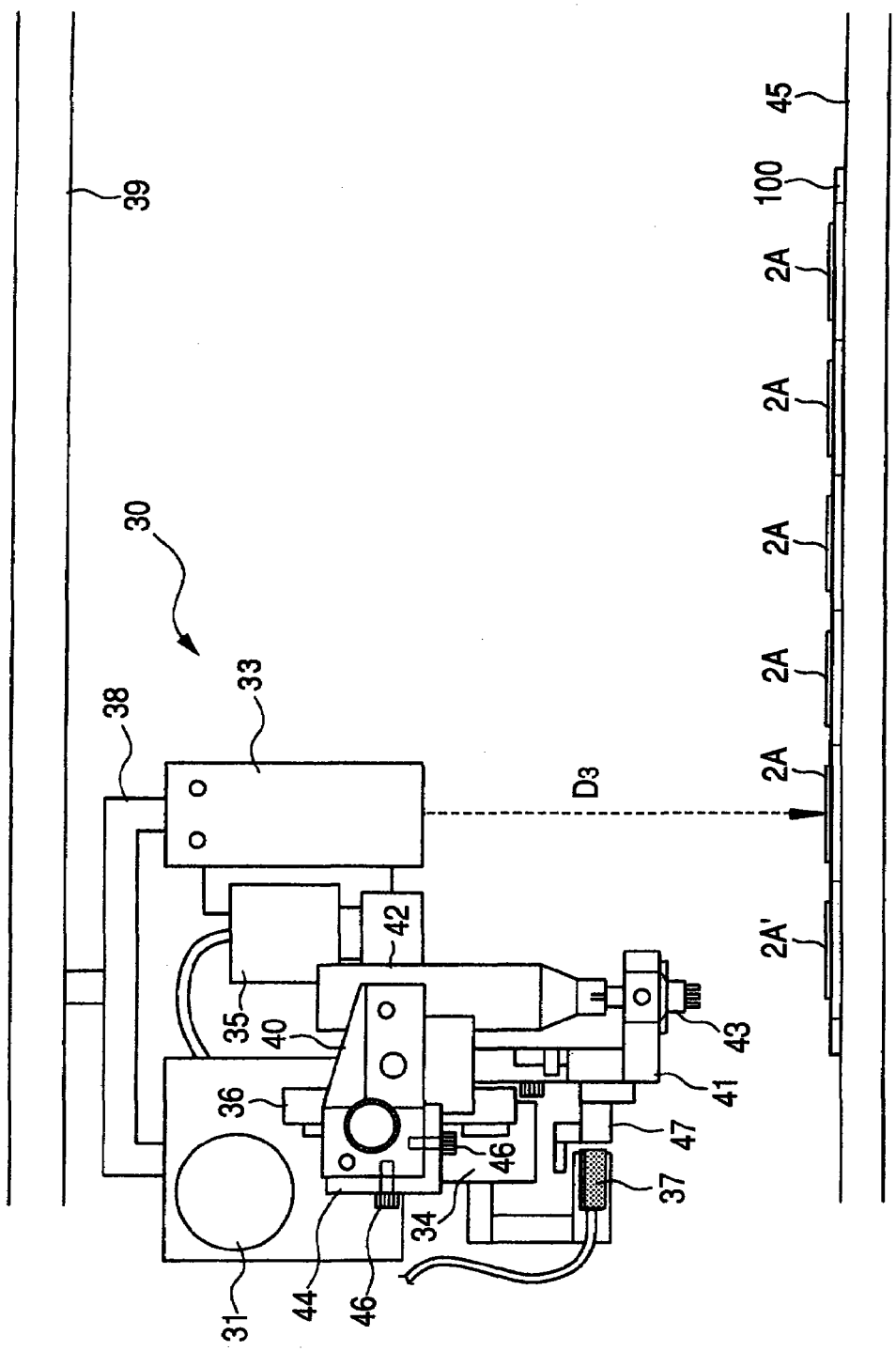
FIG. 28 is a schematic diagram illustrating the paste application method using the paste applicator.
Figure 29:
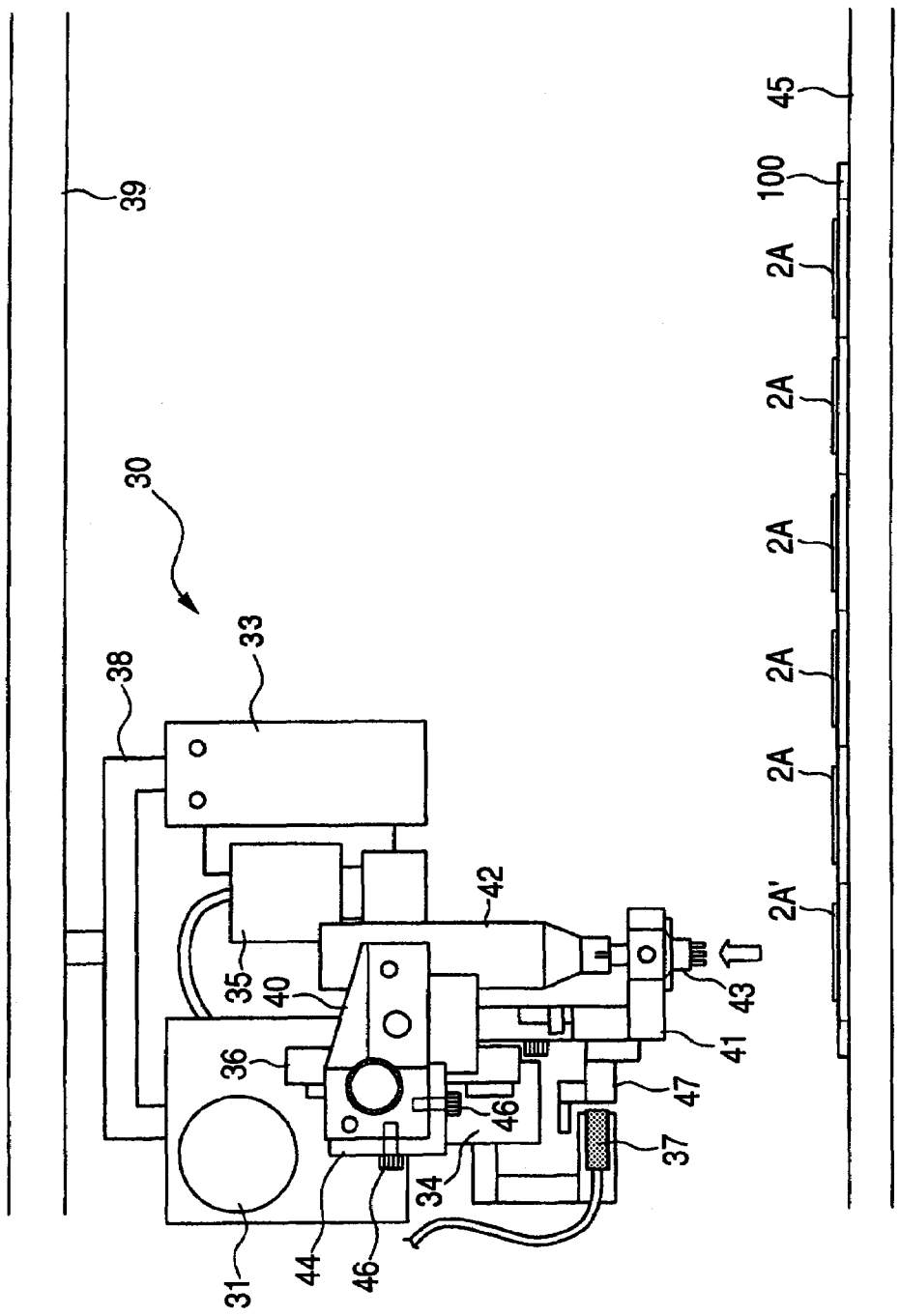
FIG. 29 is a schematic diagram illustrating the paste application method using the paste applicator.

FIG. 29 shows the position of the paste applicator 30 in a state (see FIG. 28) in which the movable section has been raised by only the distance ($D_1$) and returned to the stand-by position after measurement of the vertical distance ($D_1$) from the laser displacement meter 33 to the surface of the dummy chip 2A'. As shown in the figure, the height sensor 37 is disposed near the nozzle holder 41 in the movable section. Since the height sensor 37 is fixed to the main shaft support portion 34 which is a part of the drive section, a positional deviation with time relative to the laser displacement meter 33 which is another part of the drive section can be ignored. On the other hand, a projection 47 which serves as a reference mark at the time of detecting the height of the movable section with use of the height sensor 37 is provided in part of the nozzle holder 41. The reference mark may be constituted by any other mark than the projection 47 insofar as it can be detected by the height sensor 37.

Figure 30:
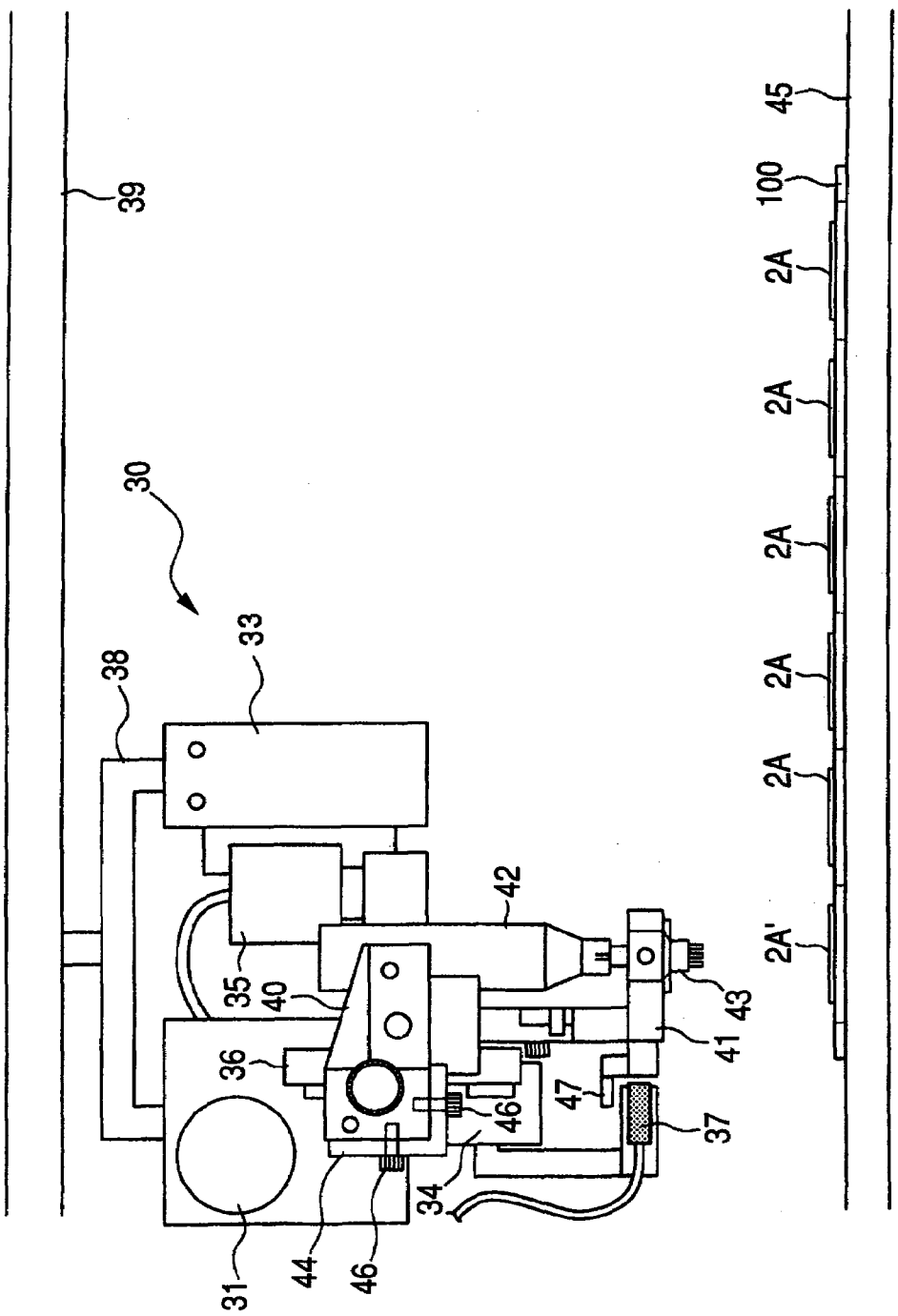
FIG. 30 is a schematic diagram illustrating the paste application method using the paste applicator.

The portion to which the height sensor 37 is to be fixed is not limited to the main shaft support portion 34. The same sensor may be disposed at any position in the drive section. Likewise, the member on which the projection 47 (reference mark) is to be formed is not limited to the nozzle holder 41, but the projection 47 may be formed at any position in the movable section insofar as it can be detected by the height sensor 37. However, it is preferable that the height sensor 37 and the projection 47 (reference mark) be disposed near the nozzle 43. If the height sensor 37 and the projection 47 are spaced away from the nozzle 43, a positional deviation can occur between the nozzle 43 and the projection 47 upon occurrence of a positional deviation between components in the movable section. Such a positional deviation may result in deterioration of the accuracy at the time of correcting the descent distance of the nozzle 43. For example, as shown in FIG. 30, by disposing the projection 47 and the height sensor 37 at positions closer to the nozzle 43 than the positions shown in FIG. 29, the descent distance correcting accuracy for the nozzle 43 can be further improved.

Figure 31:
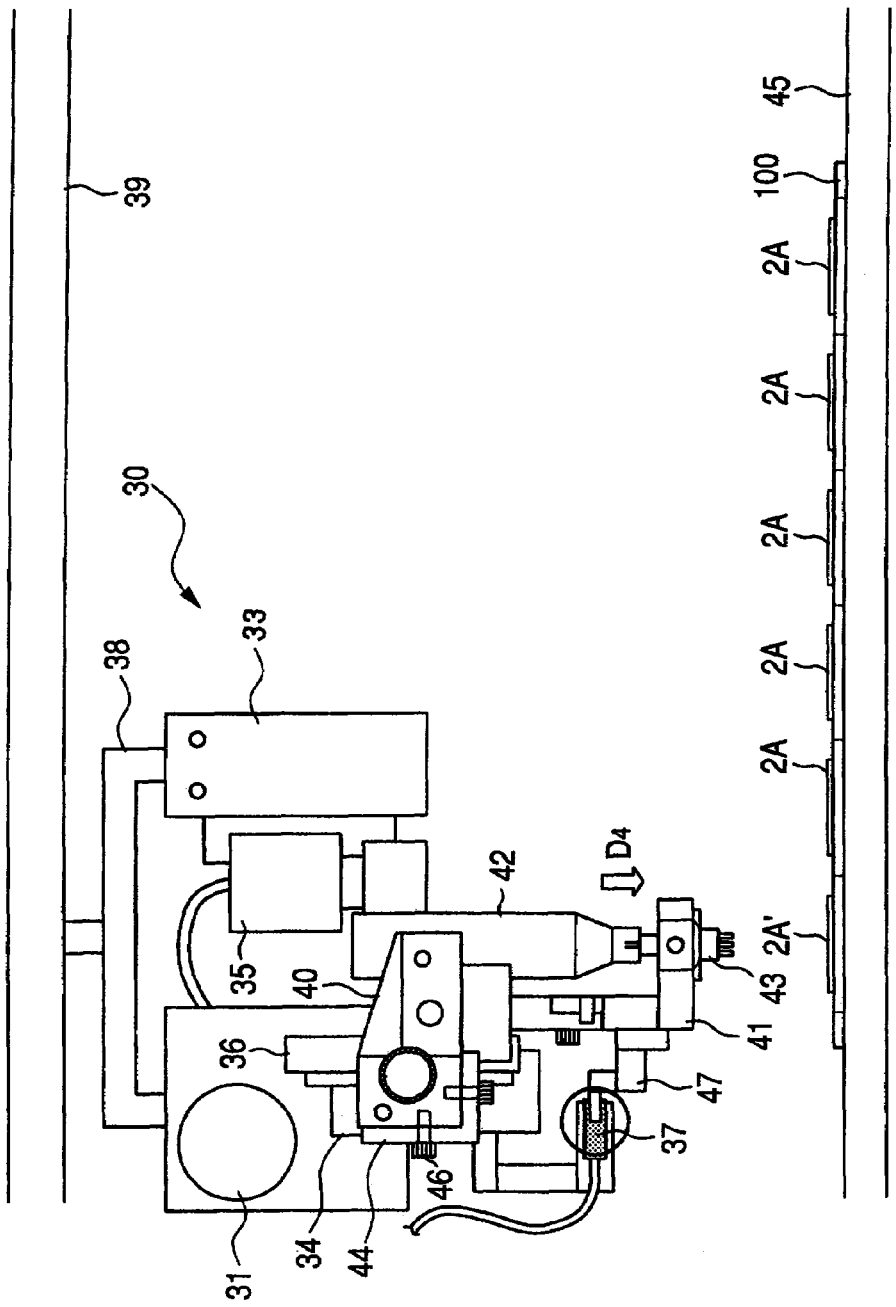
FIG. 31 is a schematic diagram illustrating the paste application method using the paste applicator.

Next, as shown in FIG. 31, the motor 31 in the drive section is rotated, causing the movable section to move down until the projection 47 in the movable section reaches the position (reference position) opposed to the height sensor 37. At this time, the distance ($D_4$) at which the movable section has moved from the stand-by position shown in FIG. 29 to the reference position shown in FIG. 30 is measured accurately on the basis of the number of revolutions of the motor 31 and is inputted to the control section in the paste applicator 30.

Figure 32:
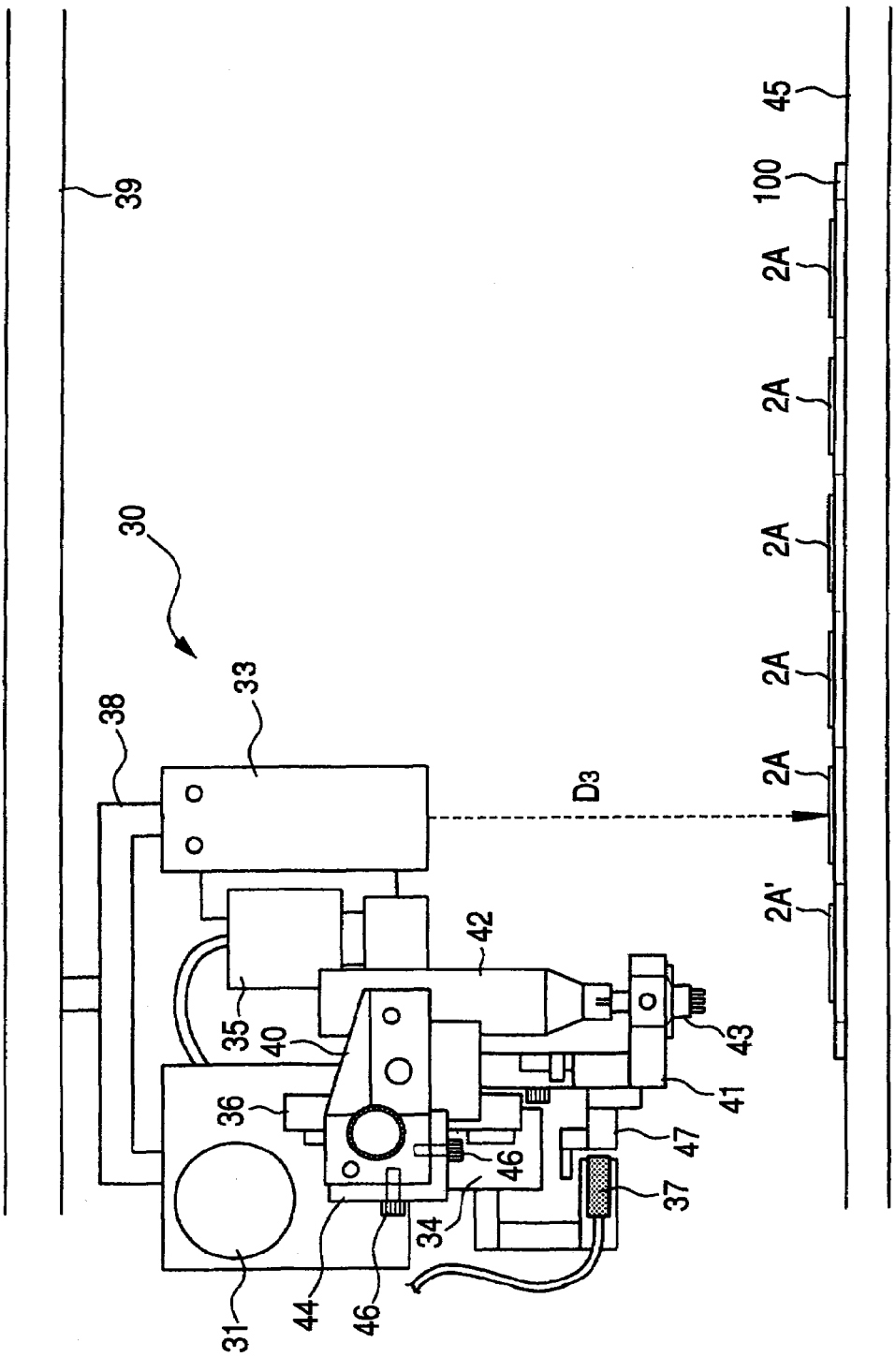
FIG. 32 is a schematic diagram illustrating the paste application method using the paste applicator.

Next, as shown in FIG. 32, the movable section in the paste applicator 30 is raised by only the distance ($D_4$) and is thereby returned from the discharge position to the stand-by position. Thereafter, the drive section is moved horizontally to position the laser displacement meter 33 above the memory chip 2A adjacent to the dummy chip 2A'. Then, laser light is radiated from the laser displacement meter 33 to the surface of the memory chip 2A and reflected light is detected to measure a vertical distance ($D_3$) from the laser displacement meter 33 to the surface of the memory chip 2A. For example, in the case where the surface of the memory chip 2A is depressed by a with respect to the surface of the dummy chip 2A', the distance ($D_3$) becomes larger by $\alpha$ than the reference distance ($D_2$) ($D_3=D_2+\alpha$). Therefore, the foregoing first correction is performed to correct the descent distance of the movable section from $D_1$ to ($D_1+\alpha$).

Figure 33:
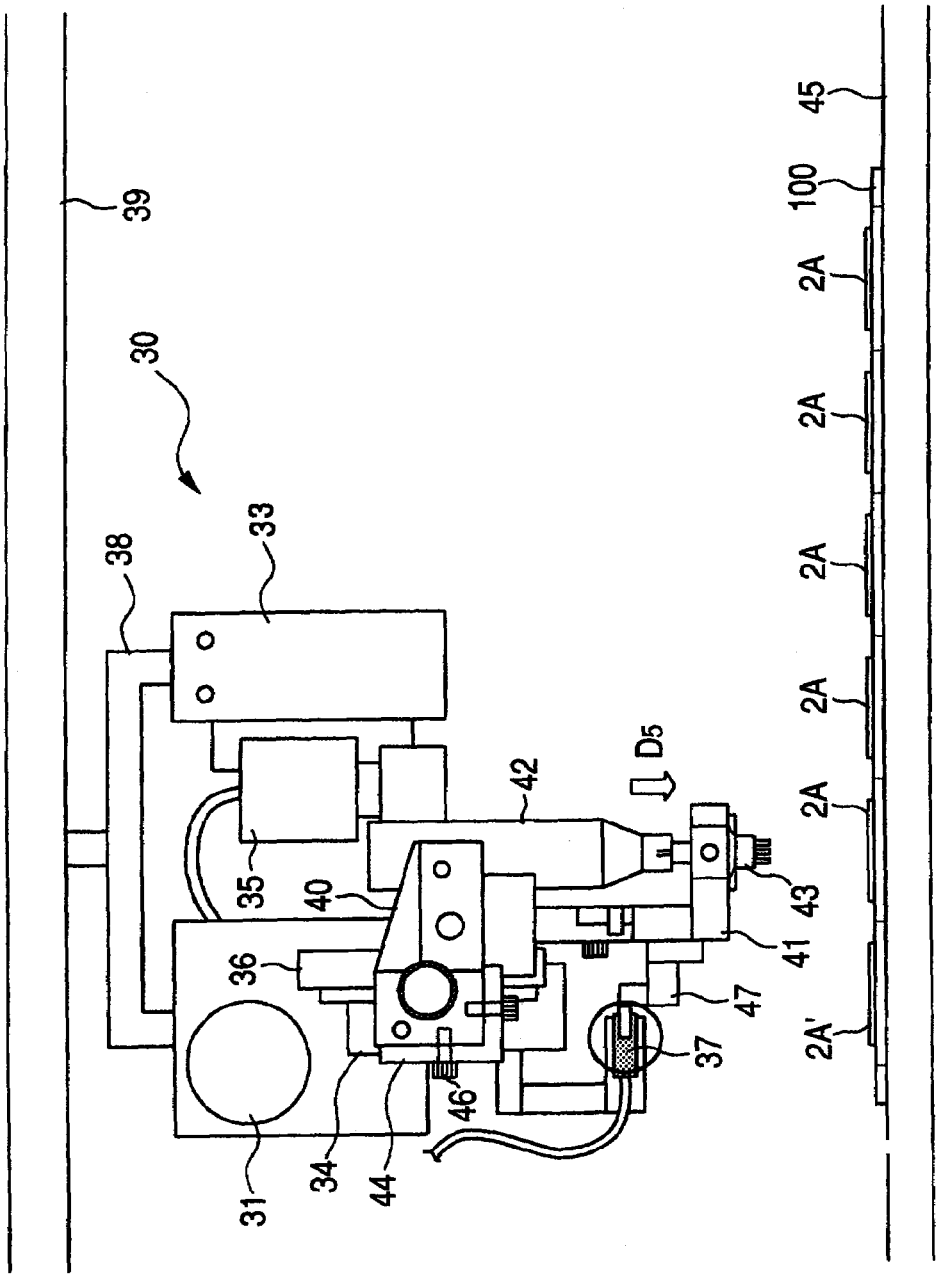
FIG. 33 is a schematic diagram illustrating the paste application method using the paste applicator.

Next, as shown in FIG. 33, the motor 31 in the drive section is rotated, causing the movable section to move down until the projection 47 in the movable section reaches the position opposed to the height sensor 37. Then, a descent distance ($D_5$) of the movable section at this time is measured on the basis of the number of revolutions of the motor 31 and whether the distance ($D_5$) is equal to the reference distance ($D_4$) or not is checked. As a result, if the difference ($D_5$-$D_4$) between the two is $\beta$ for example, it follows that the movable section has positionally deviated by $\beta$ relative to the drive section during the period from the measurement of the reference distance ($D_4$) until measurement of the distance ($D_5$).

In this case, if the movable section is moved down by the distance ($D_1+\alpha$) from the stand-by position on the basis of the foregoing first correction, the actual position of the nozzle 43 lowers by $\beta$ with respect to the discharge position. Therefore, when the value of $\beta$ is larger than the distance (about 70 to 130 μm) from the surface of the memory chip 2A to the discharge position, the tip of the nozzle 43 comes into abutment against the surface of the memory chip 2A. Therefore, the second correction taking into account the positional deviation quantity ($\beta$) of the movable section relative to the drive section is performed to correct the descent distance of the movable section from ($D_1+\alpha$) to ($D_1+\alpha-\beta$). Thereafter, the movable section is returned to the stand-by position and is moved down from this position by a distance ($D_1+\alpha-\beta$) based on the second correction, thereby causing the nozzle 43 to move to the discharge position above the memory chip 2A.

Figure 34:
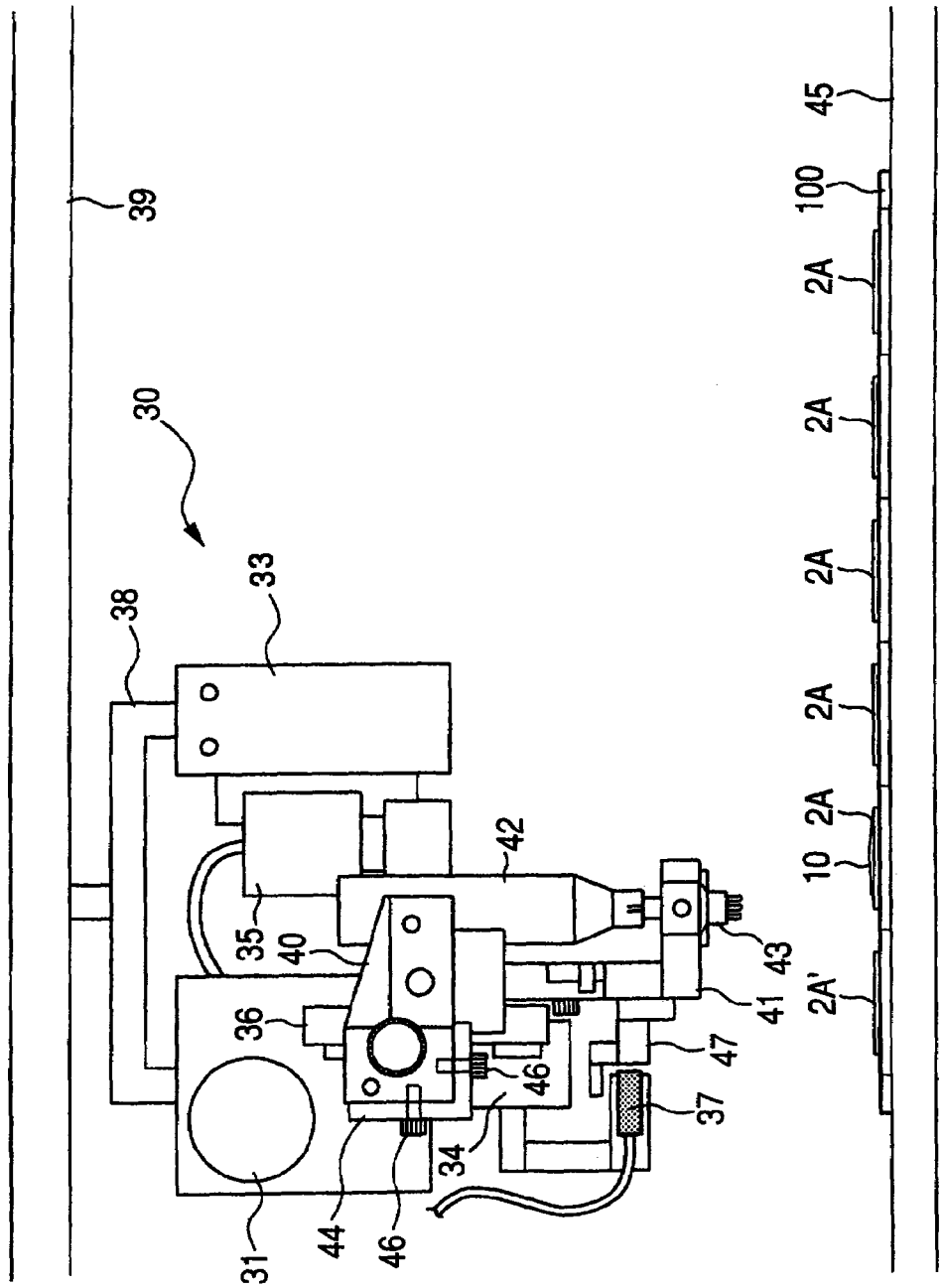
FIG. 34 is a schematic diagram illustrating the paste application method using the paste applicator.
Figure 35:
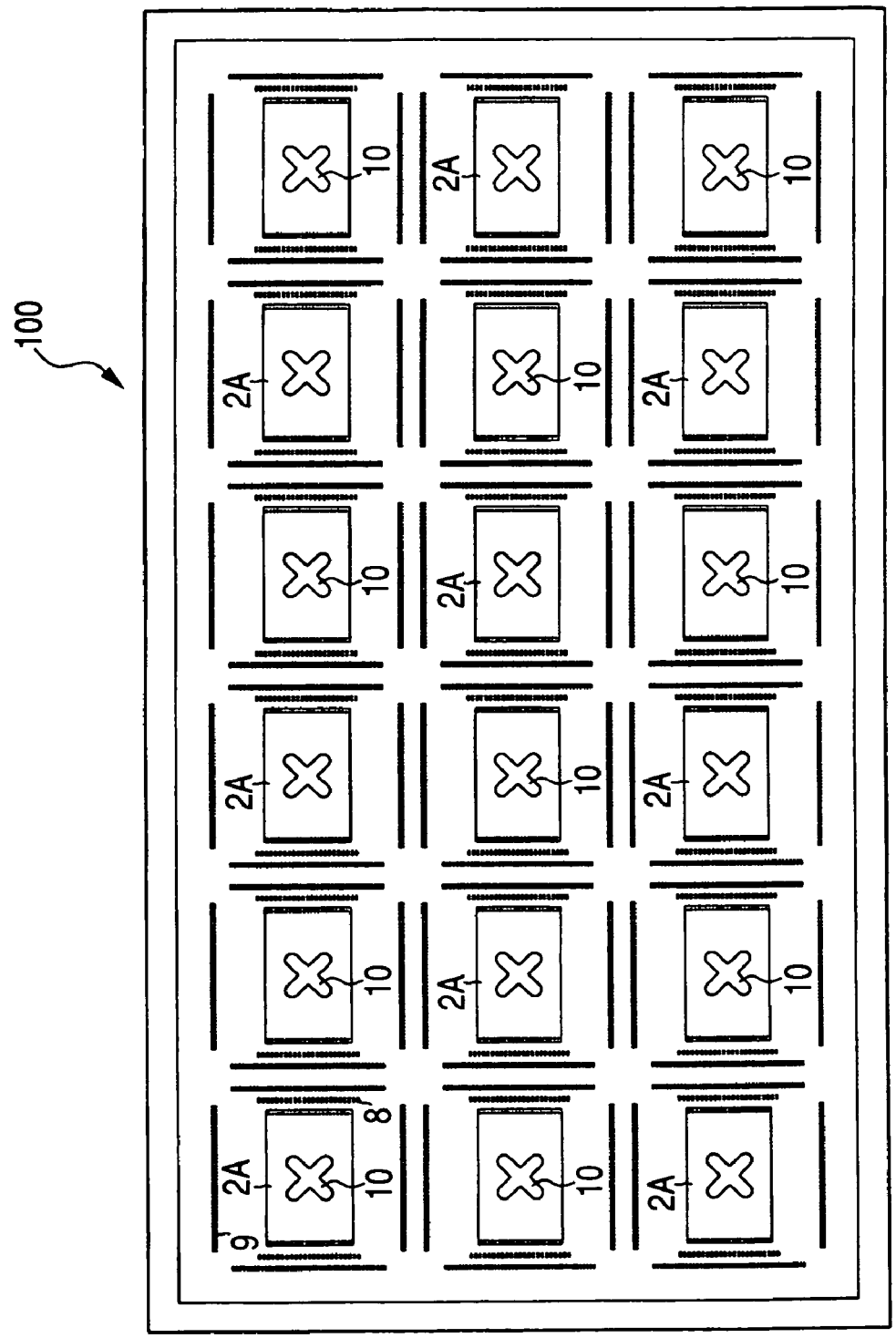
FIG. 35 is a plan view of the multi-wiring substrate, illustrating the paste application method using the paste applicator.

Next, the paste 10 is supplied from the tip of the nozzle 43 to the surface of the memory chip 2A. Thereafter, as shown in FIG. 34, the movable section is raised to the stand-by position and subsequently the drive section is moved horizontally to position the displacement meter 33 above a third memory chip 2A adjacent to the second memory chip 2. Thereafter, in accordance with the method shown in FIGS. 32 and 33, the paste 10 is applied to each memory chip 2A while correcting the descent distance of the movable section for each memory chip 2A. FIG. 35 is a plan view of the multi-wiring substrate 100, showing a state in which the paste 10 has been applied onto all the memory chips 2A.

Figure 36:
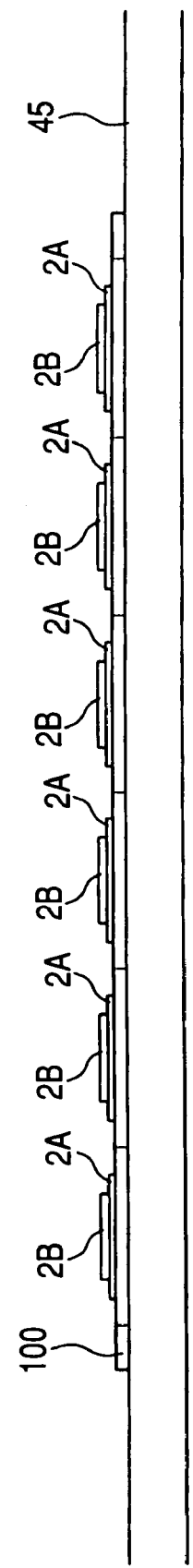
FIG. 36 is a side view of the multi-wiring substrate, illustrating the paste application method using the paste applicator.
Figure 37:
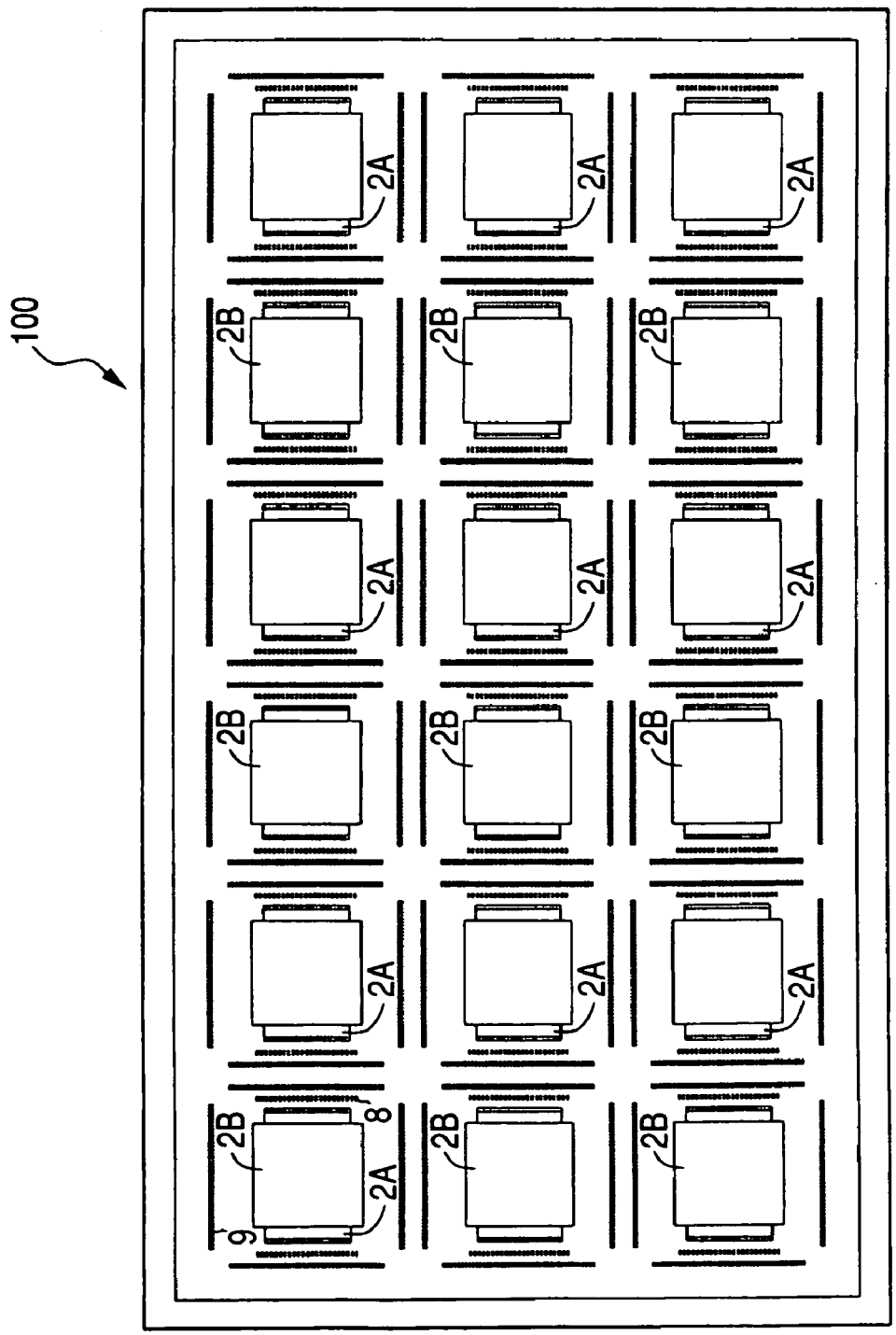
FIG. 37 is a plan view of the multi-wiring substrate, illustrating the paste application method using the paste applicator.

Next, as shown in FIGS. 36 and 37, microcomputer chips 2B are stacked on the memory chips 2A thus coated with the paste 10. The stacking of the microcomputer chips 2B may be done in accordance with the above method of mounting the memory chips 2A to the wiring substrate regions on the multi-wiring substrate 100 coated with the paste 10, and therefore an explanation thereof will here be omitted.

Figure 38:
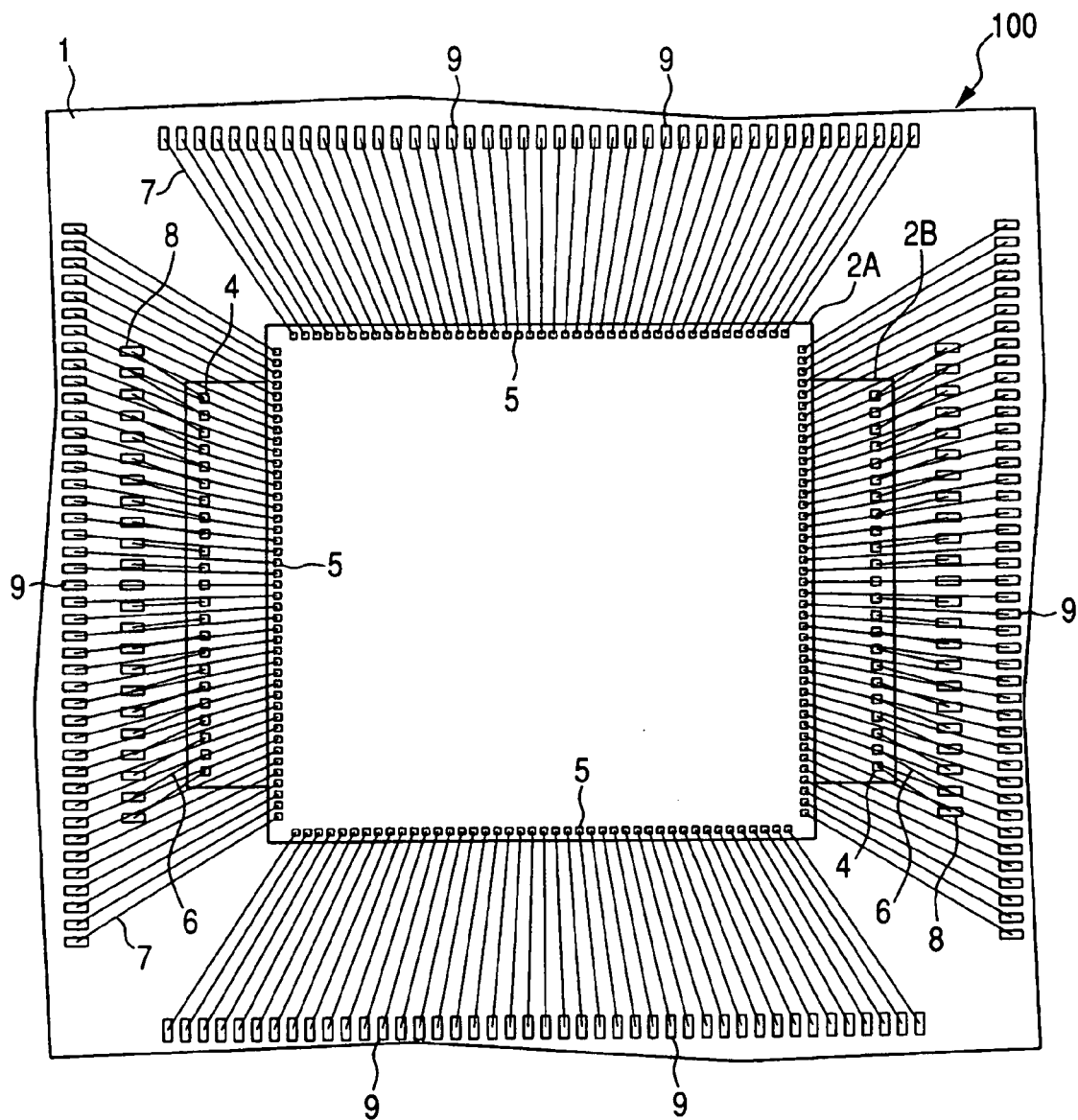
FIG. 38 is a plan view of a principal portion of the multi-wiring substrate, illustrating the paste application method using the paste applicator.

Next, as shown in FIG. 38, the bonding pads 4 of the memory chips mounted to the wiring substrate regions on the multi-wiring substrate 100 and the electrodes 8 on the multi-wiring substrate 100 are connected together through Au wires 6, while the bonding pads 5 of the microcomputer chips 2B stacked on the memory chips 2A and the electrodes formed on the multi-wiring substrate 100 are connected together through Au wires 7.

Figure 39:
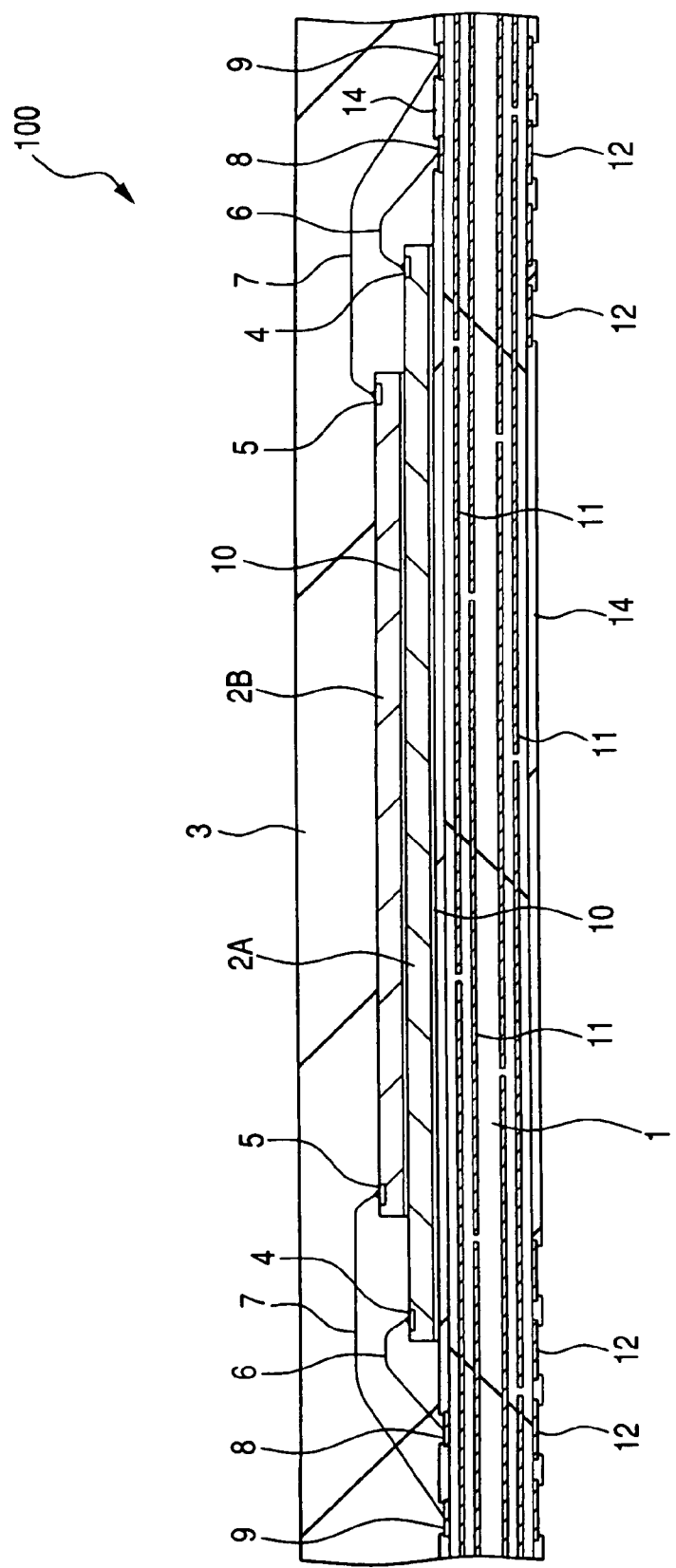
FIG. 39 is a sectional view of the principal portion of the multi-wiring substrate, illustrating the paste application method using the paste applicator.

Next, as shown in FIG. 39, all the memory chips 2A and microcomputer chips 2B mounted on the multi-wiring substrate 100 are sealed at a time with molding resin 3.

Thereafter, solder bumps 13 are connected to the back electrodes 12 formed on the lower surface of the multi-wiring substrate 100 and lastly the multi-wiring substrate 100 is diced in a lattice shape along the dicing lines L shown in FIGS. 4 and 5, whereby the BGA of this embodiment shown in FIGS. 1 and 2 is completed.

According to the manufacturing method of this embodiment described above, the BGA can be fabricated less expensively and more quickly than the manufacturing method wherein memory chip 2A and microcomputer chip 2B are stacked on the wiring substrate 1. Besides, when applying the paste 10 to the surface of the memory chip 2A, it is possible to surely prevent contact of the tip of the nozzle 43 with the memory chip 2A, so that the manufacturing yield of BGA with memory chip 2A and microcomputer chip 2B stacked on the wiring substrate 1 can be improved.

Second Embodiment

Figure 40:
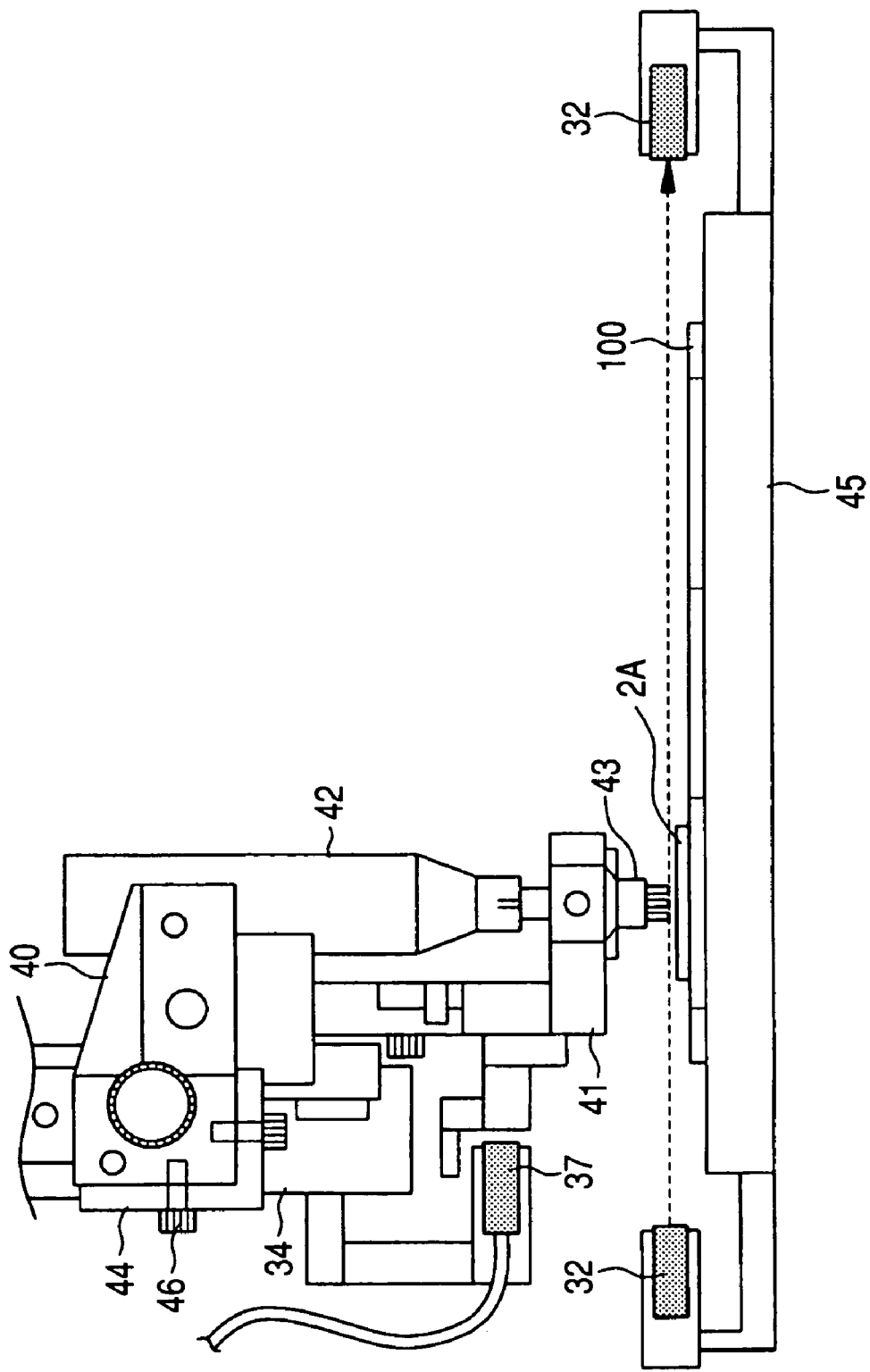
FIG. 40 is a schematic diagram of a principal portion of a paste applicator according to another embodiment of the present invention.

FIG. 40 is a schematic diagram showing a principal portion of a paste application according to this second embodiment. This second embodiment is different from the previous first embodiment in that a pair of height sensors (third measuring means) 32 are disposed on both sides of the XY table 45 which is for putting thereon of the multi-wiring substrate 100. The second height sensors 32 measure the tip height of the nozzle 43 which has moved down to the discharge position with respect to each chip and inputs the difference between the measured value and the reference height to the control section in the paste applicator 30.

For example, when the screws used to fix the nozzle 43 to the nozzle holder 41 become loose with the lapse of time and there occurs a positional deviation of the nozzle 43 relative to the nozzle holder 41, the gap between the tip of the nozzle 43 and the surface of the memory chip 2A deviates from an appropriate value (about 70 to 130 μm) even if the foregoing first and second corrections are performed.

To avoid this inconvenience, using the second height sensor 32, the height of the tip of the nozzle 43 is measured for each chip and the difference (S) between the measured value and the reference value is measured. Then, a correction taking the difference (S) into account is performed for the descent distance of the movable portion which has been obtained by the foregoing first and second corrections to calculate a distance (B"). As a result, it becomes possible to control the discharge position of the nozzle 43 more accurately and therefore the probability of the tip of the nozzle 43 contacting the surface of the memory chip 2A can be further decreased.

Although the present invention has been described above concretely on the basis of embodiments thereof, it goes without saying that the present invention is not limited to the above embodiments, but that various changes may be made within the scope not departing from the gist of the invention.

Although in the above embodiments a description has been given about checking the height of the nozzle in the paste application process, the present invention is also effectively applicable to the case where, after cleaning the paste applicator, the nozzle is again assembled in the movable section and the nozzle height is checked before repeating the paste application process. This is because it is possible to effect a highly accurate nozzle height positioning.

Although in the above embodiments the present invention is applied to the manufacture of the BGA type package, the present invention is not limited thereto, but is applicable to the manufacture of various packages of the type in which semiconductor chips are stacked on a wiring substrate with use of paste. Of course, the present invention is also applicable to the case where semiconductor chips are stacked in three or more layers.

Although in the above embodiments a description has been given about the wire bonding method wherein the first stage of semiconductor chips mounted on a multi-wiring substrate are electrically connected to the electrodes on the wiring substrate through plural wires, there may be adopted a flip chip bonding wherein the first stage of semiconductor chips are electrically connected to the electrodes on the wiring substrate through salient electrodes (solder bumps).

The present invention is applicable to the manufacture of various packages of the type in which semiconductor chips are stacked on a wiring substrate with use of paste.

What is claimed is:

1. A method of manufacturing a semiconductor device comprising the steps of:
    (a) providing a base substrate on which a plurality of first semiconductor chips are mounted,
        wherein the plurality of first semiconductor chips each has a first main surface, and a first back surface opposing to the first main surface, and
        wherein the plurality of first semiconductor chips are mounted on the base substrate such that the first back surface of each of the first semiconductor chips faces to the base substrate;
    (b) measuring a distance (A) between the first main surface of one of the plurality of first semiconductor chips and a drive section of a paste applicator having a drive motor that drives a movable section of the paste applicator with a laser displacement meter installed in the drive section of the paste applicator;
    (c) moving a nozzle supported by the movable section of the paste applicator with said drive motor to a first stand-by position located above the one of the plurality of first semiconductor chips;
    (d) lowering the movable section with the drive motor to bring down the nozzle from the first stand-by position to a first discharge position closer to the first main surface of the one of the plurality of first semiconductor chips than the first stand-by position;
    (e) raising the nozzle up with the drive motor to the first stand-by position from the first discharge position, and measuring a distance (B) output from the drive motor as a rise distance of the movable section from the first discharge position to the first stand-by position;
    (f) measuring a distance (A') between another of the plurality of first semiconductor chips and the drive section of the paste applicator with the laser displacement meter,
        wherein the another of the plurality of first semiconductor chips has a circuit formed on the first main surface;
    (g) measuring a vertical displacement quantity (C) of the movable section relative to the drive section, which occurs due to a positional deviation between the drive section and the movable section during the period from the step (a) to the (f), by using a height sensor installed in the movable section;
    (h) after the step (g), calculating a distance (B') corrected based on a difference between the distance (A) and the distance (A'), and based on the vertical displacement quantity (C),
        wherein the distance (B') is corresponding to a lowering distance of the movable section in the step (d);
    (i) after the step (h), moving the nozzle to a second stand-by position located above the another of the plurality of first semiconductor chips;
    (j) lowering the movable section with the drive motor by the distance (B') to bring down the nozzle from the second stand-by position to a second discharge position close to a first main surface of the another of the plurality of first semiconductor chips;
    (k) after the step (j), supplying a paste to the first main surface of the another of the plurality of first semiconductor chips from the nozzle; and
    (l) after the step (k), stacking second semiconductor chip over the first main surface of the another of the plurality of first semiconductor chips.

2. The method of manufacturing the semiconductor device according to claim 1, wherein the one of the plurality of first semiconductor chips is a dummy chip.

3. The method of manufacturing the semiconductor device according to claim 1, wherein the first semiconductor chip is a chip not used as a product chip.

4. The method of manufacturing the semiconductor device according to claim 1, wherein the first semiconductor chip has a plurality of first bonding pads formed on the first main surface;
    wherein the second semiconductor chip has a second main surface, a plurality of second bonding pads formed on the second main surface, and a second back surface opposing to the second main surface; and
    wherein after the step (1), the plurality of first bonding pads are electrically connected with a plurality of first electrodes of the base substrate via a plurality of first wires, and the plurality of second bonding pads are electrically connected with a plurality of second electrodes of the base substrate via a plurality of second wires.

* * * * *